United States Patent
Kitano et al.

(10) Patent No.: US 6,936,107 B2
(45) Date of Patent: *Aug. 30, 2005

(54) COATING FILM FORMING APPARATUS AND COATING UNIT

(75) Inventors: Takahiro Kitano, Kikuchi-gun (JP); Masateru Morikawa, Kikuchi-gun (JP); Yukihiko Esaki, Kikuchi-gun (JP); Nobukazu Ishizaka, Kikuchi-gun (JP); Norihisa Koga, Kikuchi-gun (JP); Kazuhiro Takeshita, Kikuchi-gun (JP); Hirofumi Ookuma, Kikuchi-gun (JP); Masami Akimoto, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/728,768

(22) Filed: Dec. 8, 2003

(65) Prior Publication Data

US 2004/0134425 A1 Jul. 15, 2004

Related U.S. Application Data

(62) Division of application No. 09/734,877, filed on Dec. 13, 2000, now Pat. No. 6,676,757.

(30) Foreign Application Priority Data

Dec. 17, 1999 (JP) ............................................. 11-359935
Dec. 20, 1999 (JP) ............................................. 11-360990

(51) Int. Cl.$^7$ ............................................. B05C 11/10
(52) U.S. Cl. ..................... 118/676; 118/713; 118/52; 118/56; 134/902
(58) Field of Search ................... 118/713, 56, 52, 118/676, 669, 50, 301; 134/902, 95.2, 102.3, 113; 414/935, 936, 937, 938, 939, 940, 941, 414; 396/611, 604

(56) References Cited

U.S. PATENT DOCUMENTS

| 5,578,127 A | 11/1996 | Kimura |
| 5,937,223 A | * 8/1999 | Akimoto et al. ............ 396/604 |
| 5,993,547 A | 11/1999 | Sato |
| 6,159,541 A | 12/2000 | Sakai et al. |
| 6,248,398 B1 | 6/2001 | Talleh et al. |
| 6,261,007 B1 | 7/2001 | Takamori et al. |

FOREIGN PATENT DOCUMENTS

| JP | 09-164364 | 6/1997 |
| JP | 09-320915 | * 12/1997 |
| JP | 12-77326 | 3/2000 |
| JP | 2000-188251 | 7/2000 |

OTHER PUBLICATIONS

Translation of JP09–320915.*

* cited by examiner

*Primary Examiner*—J. A. Lorengo
*Assistant Examiner*—George Koch
(74) *Attorney, Agent, or Firm*—Oblon, Spivak, McClelland, Maier & Neustadt, P.C.

(57) ABSTRACT

A coating film forming apparatus for forming a film by applying a coating solution to a substrate, which is provided with a cassette section, coating unit, developing unit, pretreatment/post-treatment units and a main arm for transferring the substrate between the respective units. In the coating unit, provided is a coating section in which a resist is applied on the substrate in a manner of single stroke by intermittently moving the substrate in a Y-direction and by moving a nozzle in an X-direction, and provided is a reduced-pressure drying section for drying under reduced pressure the substrate after being applied, and further provided is equipment for removing the coating film adhered to a periphery of the substrate. Additionally, when the reduced-pressure drying section is arranged outside the coating unit, the main arm is covered with a cover so that the inside thereof is under a solvent atmosphere.

21 Claims, 29 Drawing Sheets

COATING FILM FORMING APPARATUS AND COATING UNIT

CROSS-REFERENCE TO RELATED APPLICATIONS

This application is a divisional of and claims priority to U.S. patent application Ser. No. 09/734,877, filed Dec. 13, 2000, now U.S. Pat. No. 6,676,757 which claims priority to Japanese Patent Application No. 11-359935, filed Dec. 17, 1999 and Japanese Patent Application No. 11-360990, filed Dec. 20, 1999. The entire contents of the U.S. patent application is incorporated herein by reference.

BACKGROUND OF THE INVENTION

The present invention relates to an apparatus for forming a coating film on a substrate to be treated such as a semiconductor wafer or an LCD substrate (a glass substrate for a liquid crystal display) by applying a coating solution, for example, a resist solution or the like thereto, and a coating unit.

In fabrication processes of a semiconductor device or an LCD, a resist pattern for a substrate to be treated is formed by a technology called photolithography. An apparatus for forming the resist pattern is composed by connecting an aligner to a coating and developing system provided with a cassette mounting section for carrying a wafer into/from a cassette, a coating unit for applying a resist solution, thermal treatment units for performing treatments such as heating and cooling, a developing unit for performing development, a main arm for transferring the wafer and so on.

Conventionally, the resist solution has been applied in the above-described coating unit by a so-called spin coating method. This is a method by which the resist solution is spread by centrifugal force of the wafer so that a solution film is formed over the entire wafer by providing a rotatable spin chuck in a cup surrounding the sides of the substrate over the entire circumference thereof, horizontally suction-holding the wafer by the spin chuck, and rotating the wafer while supplying the resist solution to the wafer from a nozzle above the central portion of the wafer.

Incidentally, a line width of the resist pattern to be formed is proportional to a film thickness of a resist film and an exposure wavelength. Accordingly, formation of thinner films is attempted by increasing the rotational frequency of the wafer in the spin coating method since it is necessary to make a solution film thinner to a minimum in order to cope with growing demands for a finer pattern in recent years.

However, since the wafer is rotated at a high speed in the above-described method, there is a problem that a circumferential speed of the inner circumferential portion of the wafer becomes high compared with that of the outer circumferential portion thereof, whereby air turbulence occurs at the outer peripheral portion of the wafer particularly when the wafer is upsized. The turbulence becomes a factor of impairing the formation of finer patterns since it changes the film thickness, bringing about the non-uniformity in film thickness of the entire wafer.

Further, the resist solution is spread to be blown off from the central portion of the wafer toward the peripheral portion thereof, causing a big waste of resist solution since it scatters from the peripheral portion thereof to the side of the cup. In addition, there has been a problem that the resist solution applied to portions except for a circuit formation region such as the peripheral portion or the resist solution adhered to the cup due to the scatter is hardened, which results in a cause of particles.

In view of such circumstances, a method independent of the spin coating method has been examined. According to this method, a resist solution is supplied to a wafer W in a manner of so-called single stroke by reciprocating a nozzle N in an X-direction and at the same time intermittently moving the wafer W in a Y-direction while supplying the resist solution RE from a discharge hole having a fine diameter of the nozzle N provided above the wafer W as shown in FIG. 34. Incidentally, it is preferable that the portions except for the circuit formation region on the wafer W are covered with a mask to prevent the resist solution from adhering to the periphery or the back surface of the wafer W in this case.

The wafer W is not rotated in this method, whereby the inconvenience as described above is resolved and application can be performed without causing waste. However, a thinner which dissolves a resist constituent is not shaken off unlike in the spin coating and remains intact on the wafer. For example, although no more than about 10% of the thinner remains when the spin coating is performed, substantially 100% of the thinner remains in the manner of single stroke. Therefore, when the wafer is transferred to a heating plate and undergoes drying after being applied with the resist solution, it requires long time to volatilize the thinner, and an amount of volatilization varies within the wafer since it is hard to evenly conduct heat to the resist solution, whereby the uniformity in film thickness of the film to be obtained is deteriorated even if the resist solution is uniformly applied purposely. Further, variations in the amount of volatilization within wafer become wide while the wafer is transferred to the heating plate by a main arm since the amount of volatilization is large on the wafer after being applied with the resist solution, also resulting in a factor which deteriorates the uniformity in film thickness of the resist film.

BRIEF SUMMARY OF THE INVENTION

The present invention is made in view of the aforesaid circumstances and its object is to provide a coating film forming apparatus capable of increasing yields of a coating solution and forming a uniform coating film, and a coating unit.

A coating film forming apparatus according to the present invention comprises a cassette mounting section on which a substrate cassette housing a plurality of substrates is mounted, a coating unit for applying the coating solution to the substrate taken out of the substrate cassette which is mounted on the cassette mounting section, plural treatment units for performing at least either pre-treatment or post-treatment for treatment of applying the coating solution, and a main transfer mechanism for transferring the substrate between the coating unit and the treatment units, the coating unit having (a) a coating section including a substrate holding portion for holding the substrate, a coating solution nozzle for discharging the coating solution to the substrate, provided to be opposed to the substrate held by the substrate holding portion, and a drive mechanism for moving the coating solution nozzle relatively to the substrate along a surface thereof while discharging the coating solution to the surface of the substrate from the coating solution nozzle, and (b) a reduced-pressure drying section for drying under a reduced-pressure atmosphere the substrate which is applied with the coating solution in the coating section. In this invention, application is performed while the coating solution is discharged, for example, in a line shape having a fine diameter from the coating solution nozzle. In addition it is preferable to employ a mask for covering portions except for a region of coating film formation on the substrate and receiving the coating solution from the coating solution nozzle.

According to this invention, quick drying can be performed since drying is performed under reduced pressure even if a large amount of solvent remains in the coating solution applied to the substrate, and a temperature of the coating film within wafer can be maintained uniform by non-heating or heating at a low temperature even if heating is performed. Additionally, drying under reduced pressure can be quickly performed before volatilization of the solvent proceeds so far without waiting the main transfer mechanism after the application since the reduced-pressure drying section is provided in the coating unit, whereby the uniformity within the substrate in film thickness of the coating film can be maintained. Hence, it is possible to increase the yields of the coating solution and besides form the uniform coating film.

The coating unit may be structured to so as to be provided with a coating film removing section for removing the coating film at a peripheral portion of the substrate which is dried under reduced pressure in the reduced-pressure drying section, and in this case it may be structured so as to be provided with an auxiliary transfer mechanism for transferring the substrate between the substrate holding portion, the reduced-pressure drying section, and the coating film removing section. Further, the reduced-pressure drying section may be structured so as to have a mounting portion for placing the substrate thereon, a closed container for making an atmosphere in which the substrate is placed on the mounting portion a closed atmosphere, and pressure reducing means for reducing pressure inside the closed container, and in this case it may be structured that the closed container is divided into an upper side portion and a lower side portion, and the upper side portion and the lower side portion are provided to detachably join with each other. The mounting portion in the reduced-pressure drying section may be used also as the substrate holding portion in the coating section.

To be more specific, the coating film removing section may be structured to be provided with a substrate holding portion for holding the substrate, a surrounding member having a C-shape cross section so as to sandwich the peripheral portion of the substrate held by the substrate holding portion, a solvent nozzle provided to be opposed to the surface of the substrate in the surrounding member, and suction means for sucking an atmosphere surrounded by the surrounding member. Further a detecting portion for optically detecting the peripheral portion of the substrate held by the substrate holding portion in the coating film removing section may be provided and the substrate holding portion may be rotated so that the substrate is oriented in a predetermined direction based on a result of a detection by the detecting portion. Furthermore, reception and delivery of the substrate from/to the main transfer mechanism in the coating unit may be performed via substrate holding portion in the coating film removing section.

Moreover, the present invention may be structured as follows. Namely, it comprises a cassette mounting section on which a substrate cassette housing a plurality of substrates is mounted, a coating unit for applying the coating solution to the substrate taken out of the substrate cassette which is mounted on the cassette mounting section, plural treatment units for performing at least either pre-treatment or post-treatment for treatment of applying the coating solution, a reduced-pressure drying unit for drying under a reduced-pressure atmosphere the substrate which is applied with the coating solution in the coating unit, provided as one of the plural treatment units, and a main transfer mechanism for transferring the substrate between the coating unit and the treatment units, the coating unit having a substrate holding portion for holding the substrate, a coating solution nozzle for discharging the coating solution to the substrate, provided to be opposed to the substrate held by the substrate holding portion, and a drive mechanism for moving the coating solution nozzle relatively to the substrate along a surface thereof while discharging the coating solution to the surface of the substrate from the coating solution nozzle, the main transfer mechanism having a holding member for holding the substrate and atmosphere forming means for making an atmosphere in which the substrate is held by the holding member an atmosphere in which vaporization of solvent is inhibited. In this invention, a coating film removing unit for removing the coating film at the peripheral portion of the substrate which is dried under reduced pressure in the reduced-pressure drying unit may be provided as one of the treatment units. The atmosphere forming means has, for example, a cover body for surrounding a circumference of the substrate held by the holding member and, for example, means for supplying solvent vapor. Alternatively, the atmosphere forming means may be means for making the atmosphere at least either an atmosphere at a predetermined temperature or an atmosphere at a predetermined humidity. Only the cover body may be provided.

According to such invention, the volatilization of the solvent from the coating solution can be inhibited when the substrate after being applied is transferred by the main transfer mechanism, whereby it is possible to maintain the uniformity within the substrate in film thickness of the coating film. In this case, it is preferable that the main transfer mechanism has washing means for washing the holding member, for example, means for supplying a washing solution to the holding member and means for supplying gas for drying to the holding member. Further it is desirable that the main transfer mechanism has detecting means for detecting a stain of the holding member, since it is possible to determine the timing when the holding member is to be washed.

Additionally, in the present invention, a coating unit for forming a coating film on a substrate by supplying a coating solution to the substrate from coating solution discharge means comprises a container for housing the substrate therein, solvent-atmosphere generating means for supplying solvent vapor of the coating solution to the inside of the container to generate a solvent atmosphere at a predetermined concentration inside the container, intake means for sucking the atmosphere inside the container, a sensor for detecting a concentration of the solvent atmosphere inside the container, and control means for controlling operation of the solvent-atmosphere generating means and operation of the intake means based on the concentration detected by the sensor.

According to the coating unit, the concentration of the solvent atmosphere inside the container is detected by the sensor and a result of the detection by the sensor is inputted to the control means. Here, the control means operates the solvent-atmosphere generating means to generate the solvent atmosphere at the predetermined concentration inside the container when the concentration of the solvent atmosphere inside the container is lower than the predetermined concentration. On the other hand, when the concentration of the solvent atmosphere inside the container is higher than the predetermined concentration, the control means operates the intake means so that the solvent atmosphere inside the container is sucked. Accordingly, the concentration of the solvent atmosphere inside the container can be maintained constant since it is possible to rapidly cope with the concentration change of the solvent atmosphere.

According to the coating unit, it is possible to increase the yields of the coating solution and besides form the uniform coating film. In addition, it is possible to rapidly cope with the concentration change of the solvent atmosphere inside the container, thereby enabling the concentration of the solvent atmosphere to be maintained constant. As a result, formation of the film which is a thin film and uniform in film thickness can be realized and, for example, fabrication of a semiconductor device of high quality or the like is made possible. Further, a throughput can be improved. Moreover, it is possible to rapidly generate the solvent atmosphere at the predetermined concentration inside the container by supplying the solvent vapor and maintain the solvent atmosphere inside the container at the predetermined concentration by performing intake.

In the coating unit, the solvent-atmosphere generating means has a tank for storing the solvent therein and a heating mechanism for heating the solvent in the tank, and it is preferable that heating by the heating mechanism is controlled by the control means. According to such structure, the control means accelerates heating by the heating mechanism so that an amount supplied of the solvent vapor can be increased when the concentration of the solvent atmosphere inside the container is lower than the predetermined concentration. Therefore, it is possible to rapidly make the concentration of the solvent atmosphere inside the container the predetermined concentration.

In addition, it is preferable that the coating unit comprises a cover for opening and closing a carrier inlet/outlet of the container, the cover being formed with a slit through which the coating solution supply means is movable, an intake port being arranged in the vicinity of the slit. According to such structure, the atmosphere inside the container can be sucked through the intake port arranged in the vicinity of the slit. Moreover, the intake means may have an intake port formed on the container so that intake may be performed also through this intake port.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will be explained hereinafter with reference to the drawings.

To begin with, an embodiment, in which the present invention is applied to a pattern forming system for forming a resist pattern, will be explained.

(First Embodiment)

Figure 1:
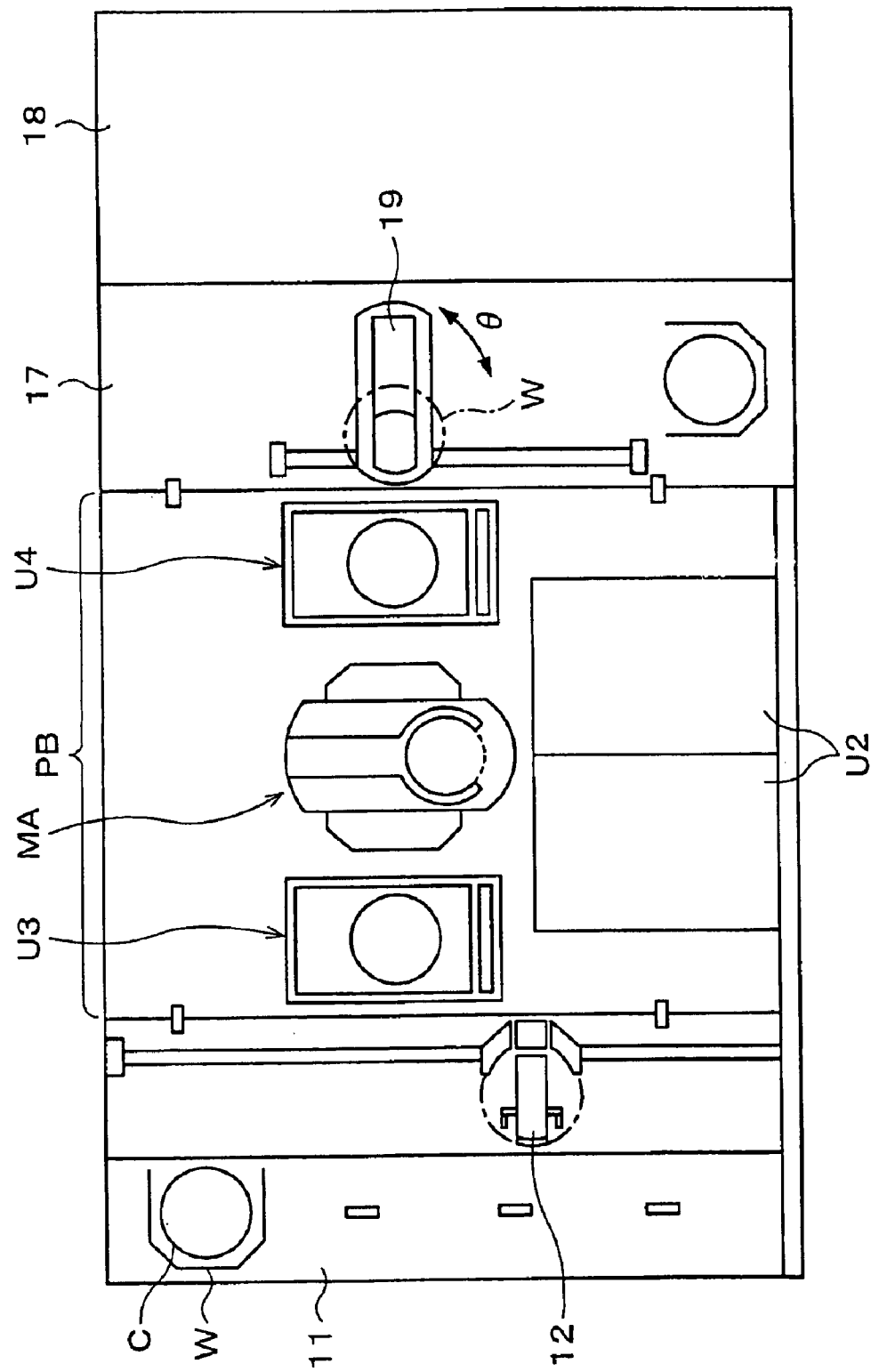
FIG. 1 is a schematic plane view showing a first embodiment in which a coating film forming apparatus of the present invention is applied to a pattern forming apparatus.
Figure 2:
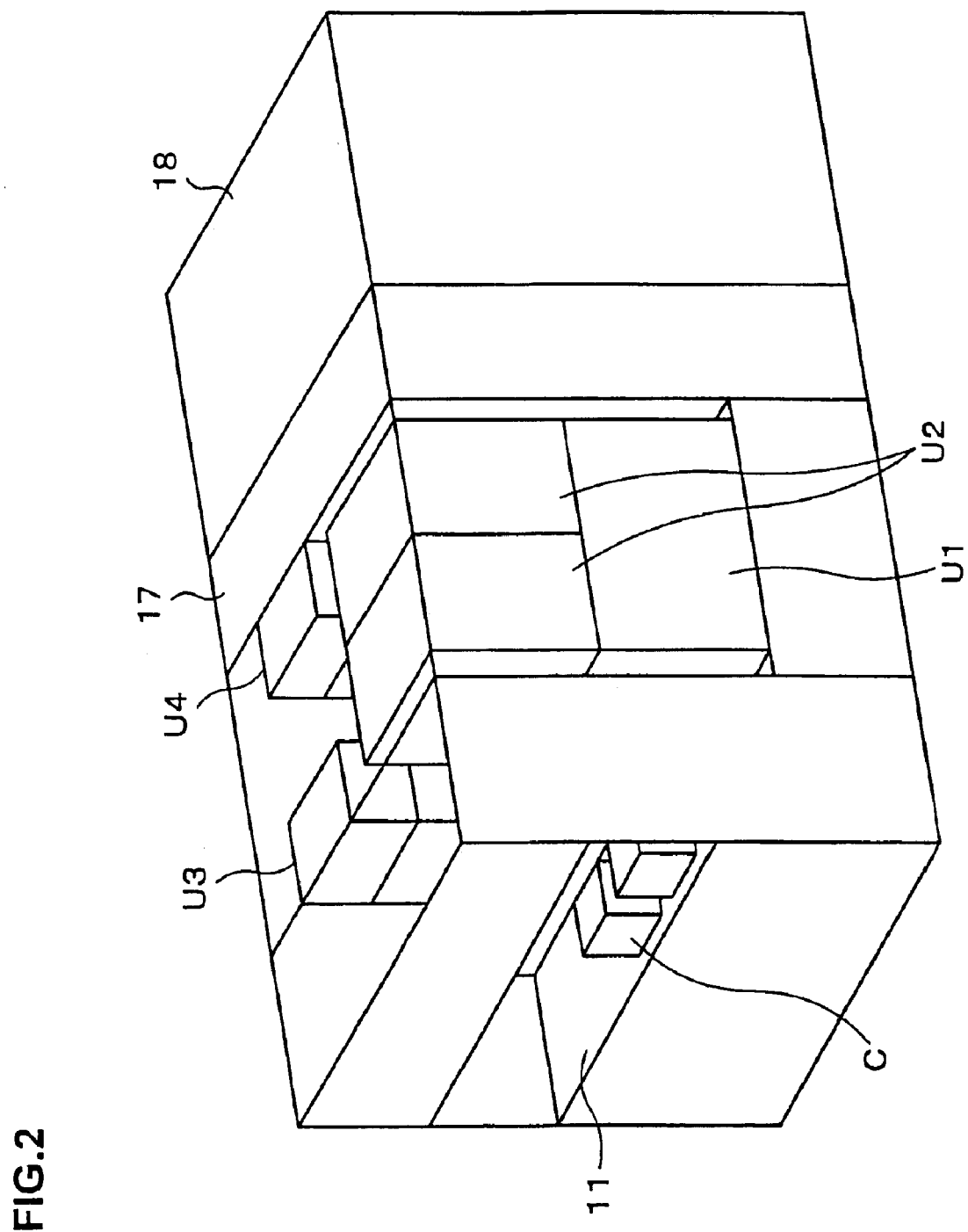
FIG. 2 is a perspective view showing an appearance of the pattern forming apparatus.
Figure 3:
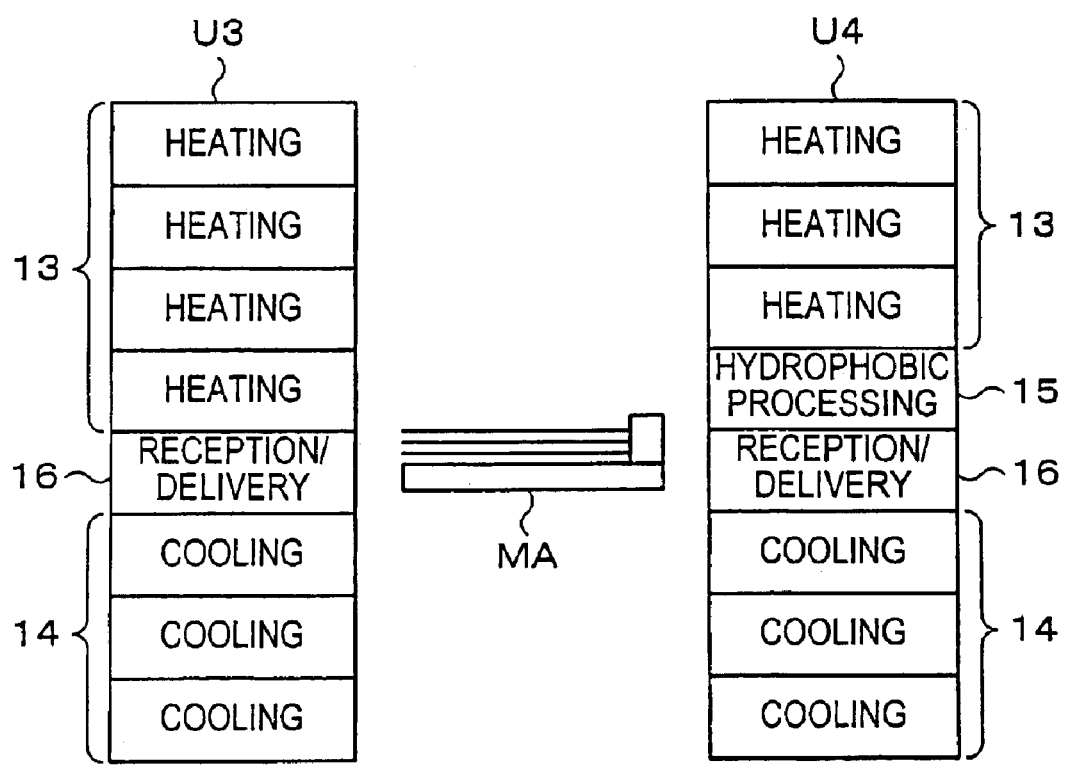
FIG. 3 is a schematic side view showing shelf units in the pattern forming apparatus.

First, a general whole structure of a pattern forming apparatus will be briefly described with reference to FIG. 1 to FIG. 3. 11 is a cassette mounting section for carrying in/out a wafer cassette which is a substrate cassette, and, for example, a cassette C, in which 25 wafers W that are substrates are housed, is mounted thereon by, for example, an automatic transfer robot. In an area facing the cassette mounting section 11, a delivery arm 12 which is a delivery mechanism for the wafer W is provided to be movable in an X-, Z-, or Y-direction and rotatable in a θ-direction (rotatable about a vertical axis). Further, at the back side of the delivery arm 12, arranged are a coating unit U1 (see FIG. 2) and a developing unit U2, for example, on the right side when the back is seen from, for example, the cassette mounting section 11, and shelf units U3 and U4 are arranged at the near side and the backside, respectively.

The shelf units U3 and U4 are formed by disposing units for performing pre-treatment and post-treatment for the coating unit U1, units for performing pre-treatment and post-treatment for the developing unit U2 and the like, in multi-tiers. For example, heating units 13 for heating the wafer W, cooling units 14 for cooling the wafer W, a hydrophobic processing unit 15 for performing hydrophobic processing on the surface of the wafer W, and the like are tiered as shown in FIG. 3. Incidentally, the heating units 13 and the cooling units 14 have structures in which the wafer W is placed on, for example, a heating plate and a cooling plate. Moreover, in the shelf units U3 and U4, incorporated are delivery sections 16 provided with delivery tables for delivering the wafer W. The structures of the shelf units U3 and U4 in FIG. 3 are shown for the sake of convenience in explaining and practical units are not limited to these ones. Incidentally, an example, in which the two developing units U2 are tiered on the single coating unit U1, is shown in this example. In addition, a main arm MA for receiving and delivering the wafer W from/to the coating unit U1, the developing units U2, and the shelf units U3 and U4, which is structured so as to, for example, freely ascend and descend, be movable back and forth, and be rotatable about a vertical axis, is provided. However, the main arm MA is not drawn in FIG. 2 for the sake of convenience.

The above-described area including the respective units U1 to U4 will be called processing blocks PB, and an aligner 18 is connected to the back side of the processing blocks PB through an interface block 17. The interface block 17 receives and delivers the wafer W from/to the aligner 18 by a wafer transfer arm 19 which is structured so as to, for example, freely ascend and descend, be movable back and forth, and be rotatable about a vertical axis.

Figure 4:
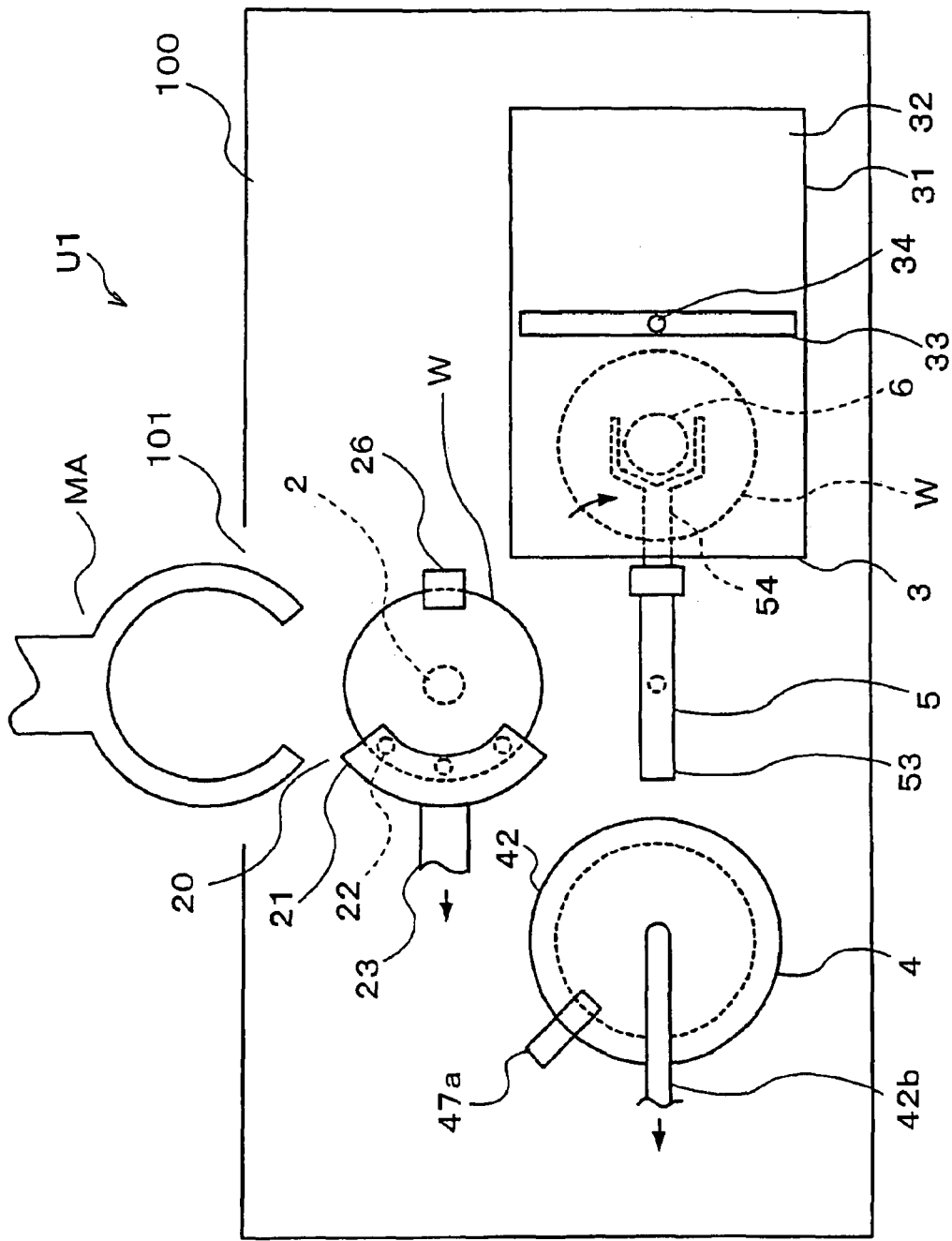
FIG. 4 is a plane view showing a coating unit employed in the embodiment.
Figure 5:
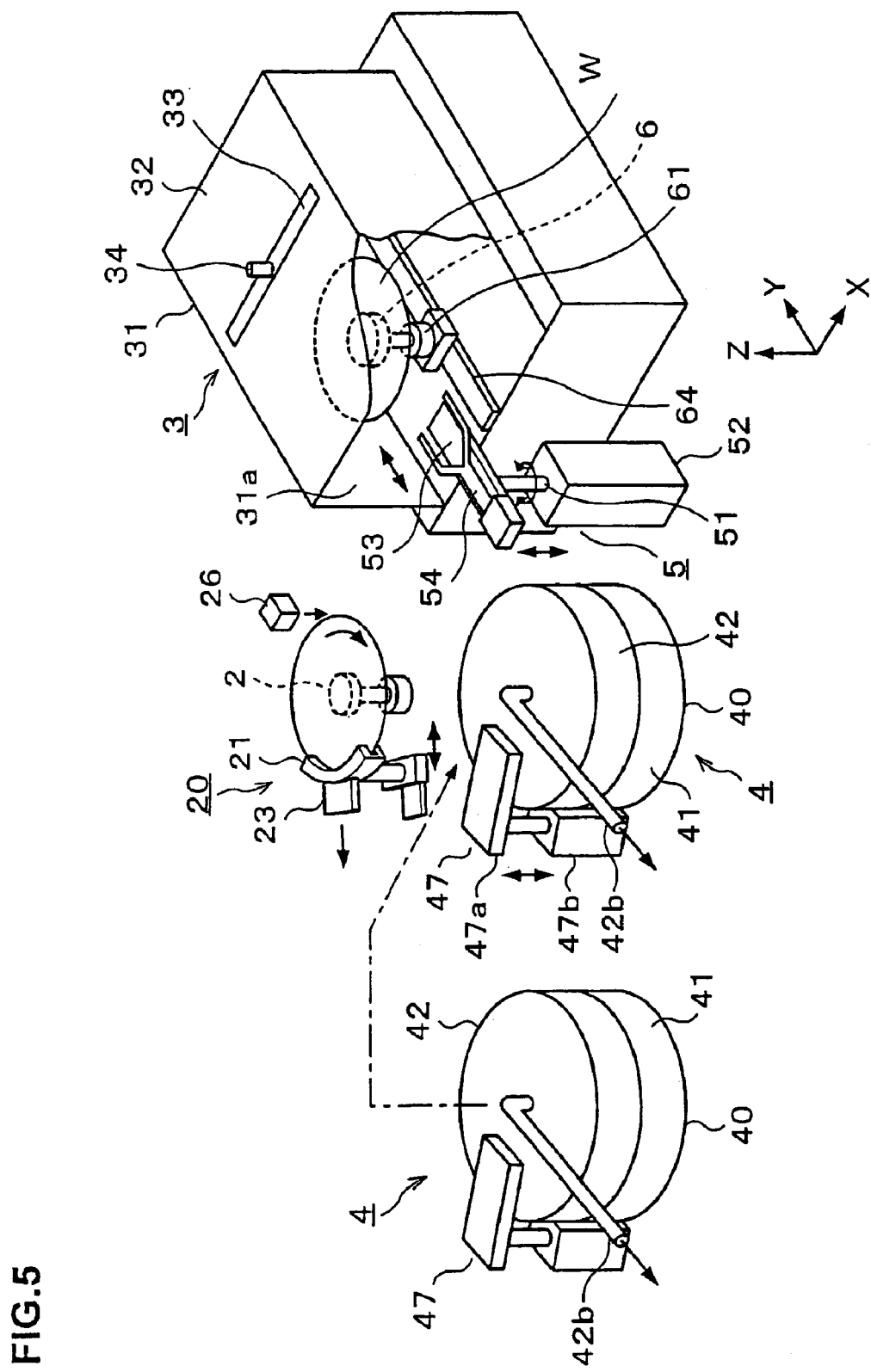
FIG. 5 is a perspective view showing an internal structure of the coating unit employed in the embodiment.

Next, the coating unit U1 will be explained. As shown in FIG. 4 and FIG. 5, the coating unit U1 is provided with a mounting table 2 forming a substrate holding portion having, for example, a vacuum chuck function, on which the wafer W is once placed so that the wafer W that is a substrate is received and delivered from/to the main arm MA, a coating section 3 for applying a resist solution to the surface of the wafer W, reduced-pressure drying sections 4 for drying under reduced pressure the wafer W applied with the resist solution and an auxiliary arm 5 for transferring the wafer W between the mounting table 2, the coating section 3 and the reduced-pressure drying sections 4, and these respective sections are housed in a casing 100 on which a wafer transfer port 101 is formed. In the casing 100, generated is a downflow different from a downflow of cleaned gas in which the main arm MA is placed, that is, a downflow of cleaned gas which is controlled, for example, to predetermined temperature or humidity. The wafer transfer port 101 may be closed by a shutter which is not shown except for the time, for example, when the wafer W is transferred.

Figure 6:
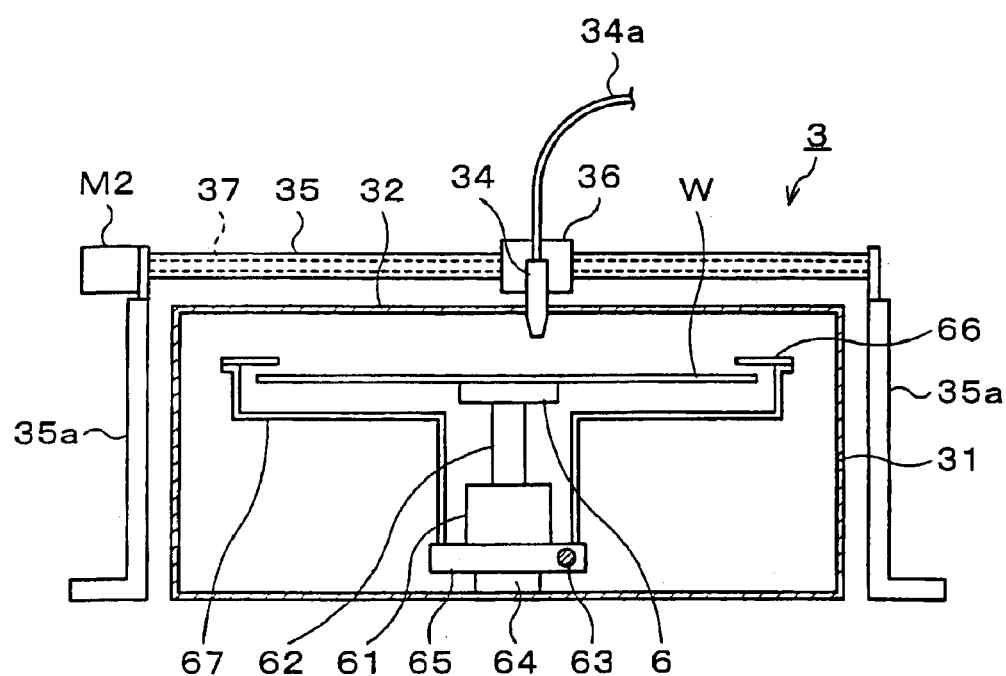
FIG. 6 is a sectional view showing a coating section provided in the coating unit.
Figure 7:
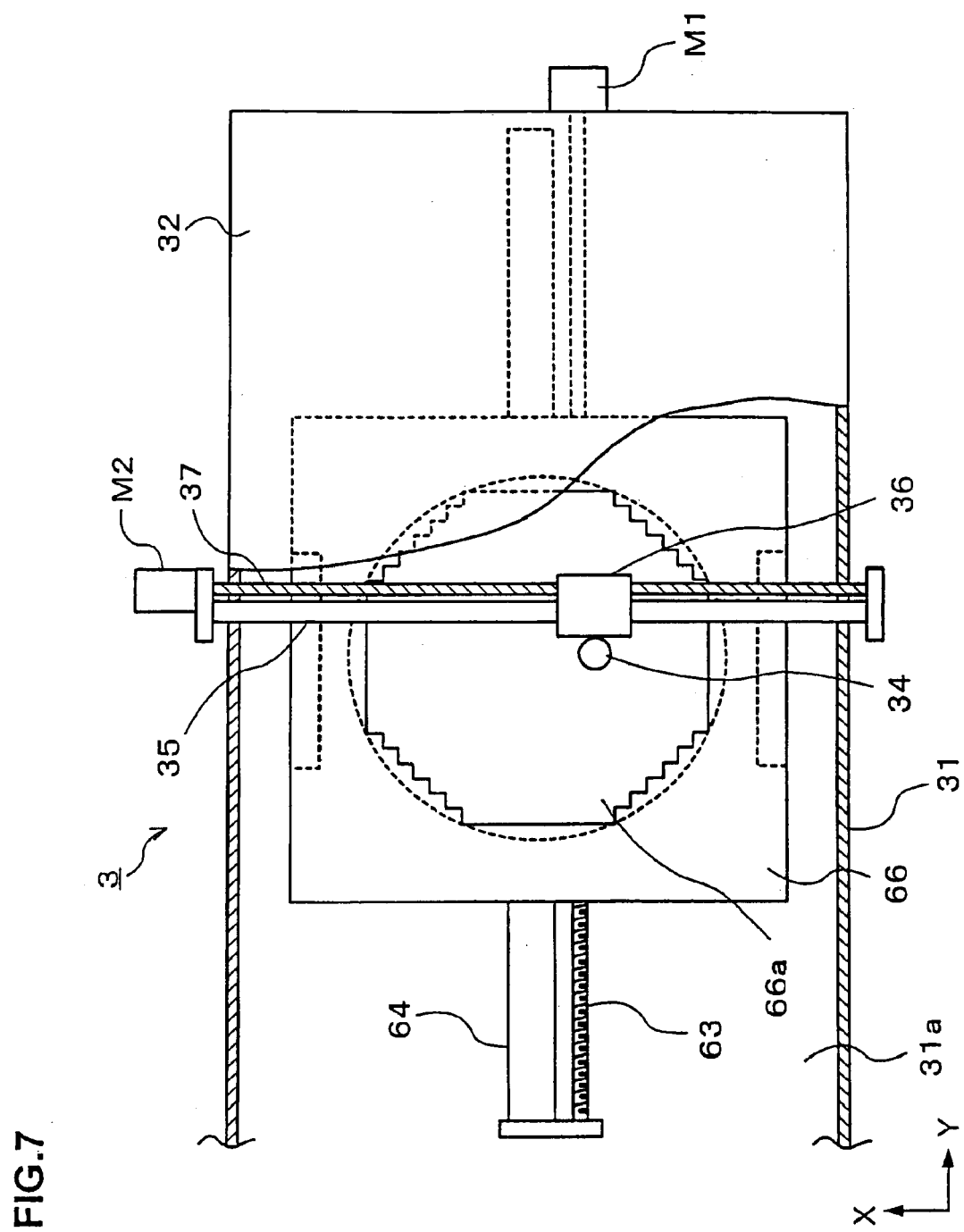
FIG. 7 is a plane view showing the coating section provided in the coating unit.

The coating section 3 has a case body 31 formed with an opening portion 31a serving as a wafer transfer port at the front thereof, and a wafer holding portion 6 provided within the case body 31, intermittently movable in a Y-direction and having, for example, the vacuum chuck function. FIG. 6 is a sectional view and FIG. 7 is a plane view showing the coating section 3, and the wafer holding portion 6 can be raised and lowered via a hoisting and lowering shaft 62 by a hoisting and lowering mechanism 61. The hoisting and lowering mechanism 61 is arranged on a moving table 65 movable in the Y-direction by a ball screw portion 63 driven by means of a motor M1 while being guided by a guide portion 64. Further, it is preferable to provide, for example, vibration generating means including an ultrasonically vibrating element although it is not shown in the wafer holding portion 6, since the uniformity of a coating film can be further improved by applying vibration to the wafer W after applying the resist solution to the wafer W. The ultrasonically vibrating element can be attached on the outer surface of the wafer holding portion 6 or attached to be embedded inside thereof.

On a top plate 32 of the case body 31, formed is a slit 33 extending in an X-direction, and in the slit 33, provided is a coating solution nozzle 34 so that its upper portion is projected from the top plate 32 and besides a discharge hole on its lower portion is positioned at the below side of the top plate 32. The coating solution nozzle 34 is connected through a liquid supply pipe 34a to a resist solution supply section which is not shown, and the discharge hole of the coating solution nozzle 34 is formed to have an exceedingly fine diameter of, for example, 10 $\mu$m to 200 $\mu$m. Moreover, it is preferable to form the coating solution nozzle 34 so that mist of the solvent is discharged from the circumference of the discharge hole for the resist solution, and this brings about an advantage that volatilization of the solvent is inhibited to thereby maintain viscosity thereof constant.

Above the top plate 32, installed is a guide portion 35 extending along the X-direction via supporting portions 35a, and the coating solution nozzle 34 is attached so as to be movable along the guide portion 35 via a moving body 36. The moving body 36 engages with a ball screw portion 37 extending in the X-direction and the coating solution nozzle 34 is made movable in the Y-direction via the moving body 36 by rotating the ball screw portion 37 by means of a motor M2. It should be noted that a region of wafer W movement is surrounded by the case body 31 to make a space in which the wafer W is placed a closed minimum space, whereby it is filled with solvent vapor when the resist solution is applied to the wafer W, which makes it possible to inhibit the volatilization of the solvent from the applied resist solution. In this case, it is desirable in improving the uniformity in film thickness to maintain a temperature in the space as constant as possible by providing temperature control means on the top plate 32.

When the coating solution nozzle 34 is moved in the X-direction while the resist solution is discharged, the resist solution adheres to the periphery of the wafer W and also spreads to the back surface thereof. In order to prevent the above-described situation, for example, a mask 66, which covers the entire peripheral portion of the wafer W and besides has an opened portion corresponding to a circuit formation region that is a coating film formation region, is provided above the wafer W. The mask 66 is mounted on mask supporting portions 67 which are attached to the moving table 65 for moving the wafer W in the Y-direction and extend from, for example, the both outsides of the wafer W to positions slightly higher than that of the surface of the wafer W. Incidentally, the mask 66 is not described in FIG. 5. Although the main body of the coating section as structured above is drawn to be provided on a box 68 in which an electrical system or the like is housed in FIG. 5, this section may be provided, for example, under the casing 100.

Figure 8:
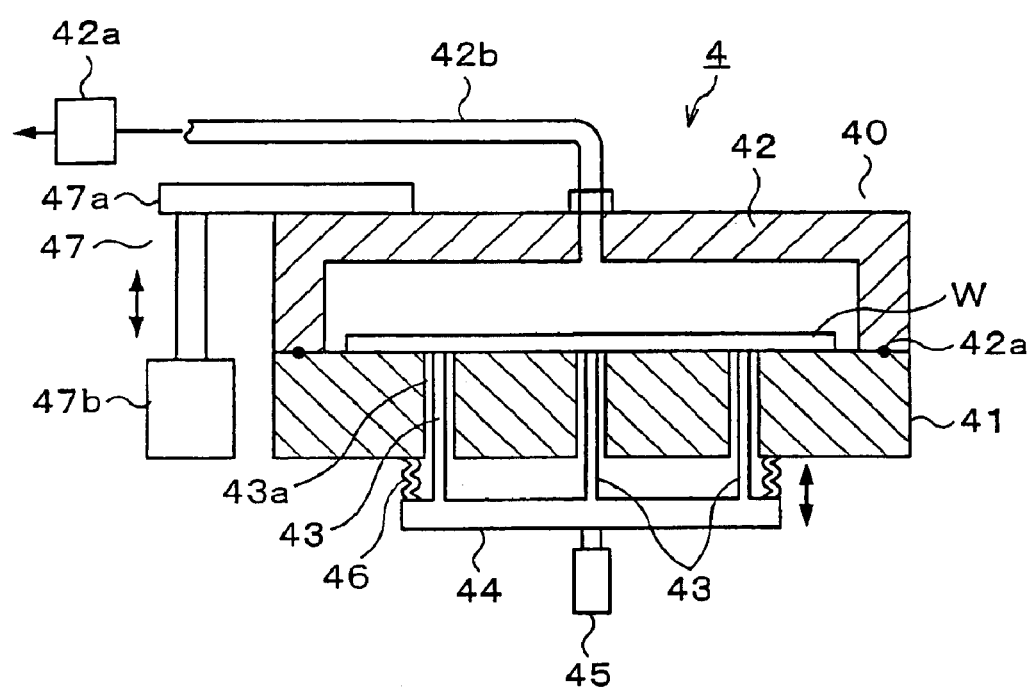
FIG. 8 is a sectional view showing a reduced-pressure drying section provided in the coating unit.

The above-described reduced-pressure drying sections 4 are vertically two-tiered in this example. Incidentally, the upper tier side of the reduced-pressure drying sections 4 is transversely drawn in FIG. 5 for the sake of convenience of the drawing. The reduced-pressure drying section 4 is provided with a mounting portion 41 for placing the wafer W thereon, and a lid body 42 for making an atmosphere in which the wafer W is placed a closed atmosphere by air-tightly joining with the peripheral portion of the mounting portion 41 via O-rings 42a which are sealing members, as shown in FIG. 8. In this example, the mounting portion 41 and the lid body 42 correspond to a lower side portion and an upper side portion described in claim, respectively, and form a closed container 40.

For example, three lifting pins 43 are provided through the mounting portion 41 so as to be raised and lowered by a hoisting and lowering portion 45 such as an air cylinder via a hoisting and lowering plate 44, so that the wafer W can be received and delivered from/to the auxiliary arm 5. Further, bellows 46 are provided between the peripheral portion of the hoisting and lowering plate 44 and the mounting portion 41 to prevent the atmosphere in which the wafer W is placed from communicating with the atmospheric side via through holes 43a for the lifting pins 43.

Meanwhile, it is structured that one end portion of a suction pipe 42b is connected to, for example, the central portion of the lid body 42, and the pressure inside the closed container 40 can be reduced to, for example, the order of 13.3 Pa by a suction pump 42c connected to the other end side of the suction pipe 42b. In this example, pressure reducing means is composed of the suction pipe 42b and the suction pump 42c.

On the lid body 42, provided is a hoisting and lowering mechanism 47 for opening and closing the closed container 40, more specifically, ascending and descending between a position where delivery of the wafer W is performed by raising the lid body 42 and a position where the lid body 42 is air-tightly joined with the mounting portion 41 by being lowered, and the hoisting and lowering mechanism 47 is composed of, for example, a hoisting and lowering arm 47a attached on the lid body 42, a drive portion 47b such as an air cylinder for operating the hoisting and lowering arm 47a, and the like.

The auxiliary arm 5 is provided with a drive portion 52 for raising, lowering, and rotating about a vertical axis a driving shaft 51, a base 53 provided on an upper portion of the driving shaft 51, and an arm 54 freely advanced and retracted along the base 53 as shown in FIG. 5.

Figure 9:
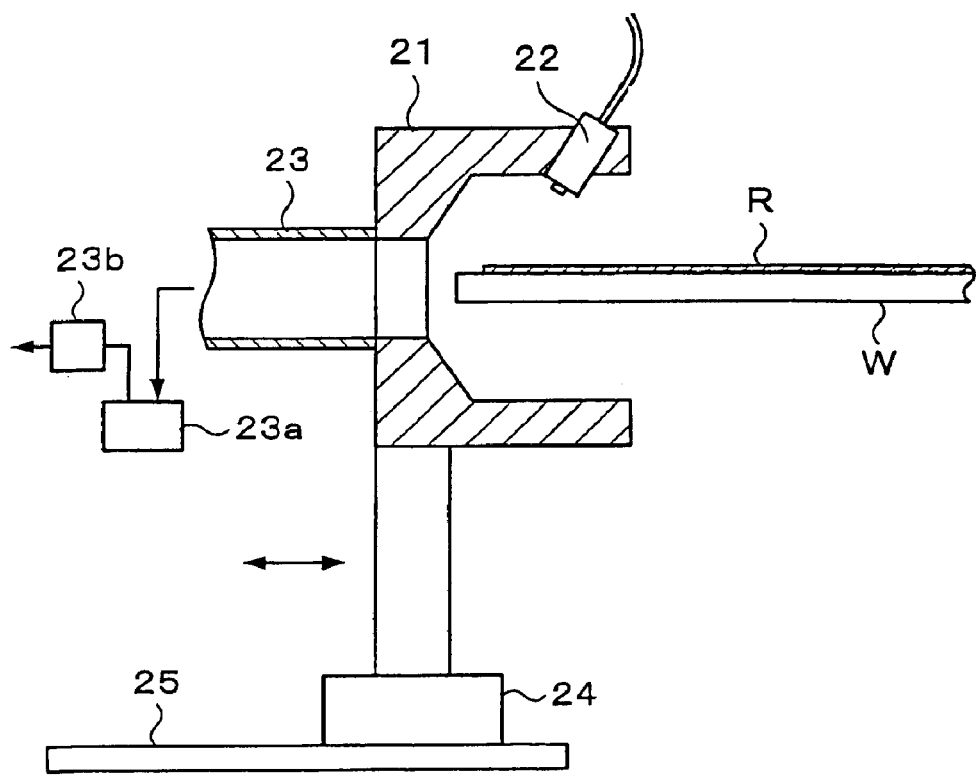
FIG. 9 is a sectional view showing a coating film removing section provided in the coating unit.

Here, returning to the explanation of the mounting table 2, the mounting table 2 is structured so as to be rotatable about a vertical axis by a rotary drive portion 2a and serves as a delivery table when the main arm MA delivers the wafer W to the coating unit U1 as already described. It forms a part of a coating film removing section 20 for removing a coating film (a resist film) at the peripheral portion of the wafer W which is applied with the resist solution and further dried under reduced pressure. The coating film removing section 20 is provided with a surrounding member 21 having C-shape in cross section and arc shape in plane so as to sandwich the peripheral portion of the wafer W placed on the mounting table 2 between both sides thereof as shown in FIG. 5 and FIG. 9. On the upper surface of the surrounding member 21, a plurality of solvent nozzles 22 (not shown in FIG. 5) are provided along a circumferential direction of the wafer W to be opposed to the surface of the wafer W and inclined, for example, outward.

A suction-passing member 23, which is formed so as to have the dimensions capable of sucking the solvent and a resist constituent of the coating film R dissolved by the solvent when the solvent is supplied from the solvent nozzles 22 to the peripheral portion of the wafer W, is connected to the outside surface of the surrounding member 21. A suction pump 23b is connected to the suction-passing member 23 through a gas-liquid separating portion 23a. Further, the surrounding member 21 is supported on a slide portion 24 and is structured so as to be movable in a diametric direction of the wafer W on the mounting table 2 while being guided by a rail 25 through the slide portion 24. The slide portion 24 and the rail 25 form a slide mechanism.

Additionally, as shown in FIG. 4 and FIG. 5, on the position which is above the region of the movement of the peripheral portion of the wafer W placed on the mounting table 2 and does not interfere with the position of the surrounding member 21 two-dimensionally, arranged is means for optically detecting the periphery of the wafer W, for example, a CCD camera 26 (a camera in which an image pickup device is employed). The CCD camera 26 composes means for aligning the wafer W together with the mounting table 2, for example, means for aligning a notch (a V-shaped notch) formed at the peripheral portion of the wafer W so as to be oriented in a predetermined direction, and it is provided in order to align the wafer W via the mounting table 2 so that the notch is oriented in the predetermined direction by rotating the wafer W one turn by means of the mounting table 2 to detect the outline of the wafer W and determine the position of the notch based on the result.

Next, an operation of the above-described embodiment will be described. Returning to FIG. 1 and FIG. 2, first, the wafer cassette C, in which the wafers W that are the substrates are housed, is carried into the cassette mounting section 11 from the outside, the wafer W is taken out of the inside of the cassette C by the wafer transfer arm 12 and delivered to the main arm MA through the delivery section 16 provided in the shelf unit U3. Second, the wafer W is transferred to the hydrophobic processing unit 15 provided in the shelf unit U3 and here the surface of the wafer W undergoes hydrophobic processing with the supply of, for example, HMDS (hexamethyldisilizane) gas and thereafter the wafer W is transferred to the coating unit U1.

Hereinafter, treatment in the coating unit U1 will be described. The wafer W on the main arm MA is placed on the mounting table 2 through the transfer port 101 of the casing 100. At this time, the surrounding member 21 is retracted to the outside. Then the mounting table 2 is rotated to align the wafer W by using the CCD camera 26 as described above. Thereafter, the auxiliary arm 5 receives the wafer W on the mounting table 2 to position it between the wafer holding portion 6 and the mask 66 in the coating section 3, and the wafer W is transferred on the wafer holding portion 6 by the relative hoisting and lowering movement of the arm 54 and the wafer holding portion 6.

Figure 10:
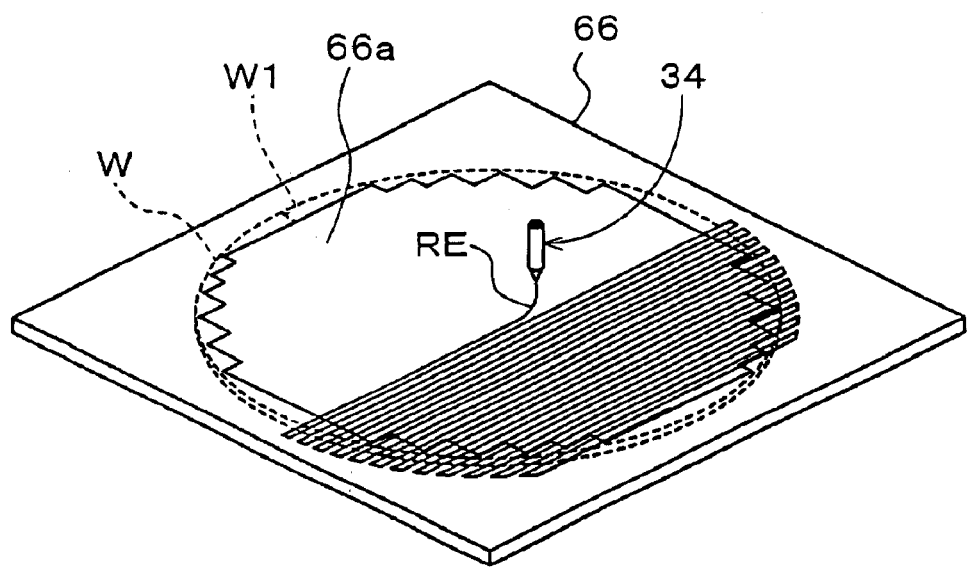
FIG. 10 is a schematic perspective view showing a manner in which a resist solution is applied on a wafer from a coating solution nozzle in the coating section.

Now, if it is assumed that an end portion of the wafer W in the back side of the case body 31 seen from the opening portion 31a of the case body 31 (the right side in FIG. 4 and FIG. 7) is a front end portion of the wafer W, the wafer holding portion 6 is arranged so that, for example, the front end portion of the wafer W is positioned in the X-direction and directly below a region of scan of the coating solution nozzle 34. Then the wafer holding portion 6 is intermittently moved in the Y-direction toward the back side of the case body 31 by means of the ball screw portion 63 while being guided by the guide portion 64. On the other hand, the coating solution nozzle 34 reciprocates in the X-direction corresponding to the timing of the intermittent movement of the wafer W. More specifically, the coating solution nozzle 34 moves from one end side of the guide portion 35 to the other end side thereof while discharging a coating solution on the wafer W when the wafer W is standing still, and subsequently the wafer W is moved a predetermined amount in the Y-direction by the wafer holding portion 6. The coating solution nozzle 34 turns at the other end side of the guide portion 35 and moves toward the one end side thereof while discharging the coating solution on the wafer W. FIG. 10 is an explanatory view showing the manner and the resist solution RE from the coating solution nozzle 34 is applied in a manner of single stroke. Incidentally, W1 in FIG. 10 is the notch for aligning. The outline of the periphery of the circuit formation region on the wafer W is, so to speak, a steps-shaped line, and although an opening portion 66a of the mask 66 has a shape fitting to this, an edge of the opening portion 66a is formed, for example, so as to be on the side slightly outer than the aforementioned outline.

Thus, the resist solution is applied over the entire face of the circuit formation region on the wafer W to form a solution film. After that, for, example, ultrasound is applied to the wafer W by the ultrasonically vibrating element so that the solution film is evened and the film thickness thereof is made uniform. When the coating processes are completed, the wafer holding portion 6 is retracted to a delivery position at the end, and the wafer W on the wafer holding portion 6 is delivered to the auxiliary arm 5 and transferred on the mounting portion 41 in the reduced-pressure drying section 4. The wafer W is transferred to the mounting portion 41 by making the lifting pins 43 project from the mounting portion 41 in advance, delivering the wafer W thereon from the arm 54, and lowering the lifting pins 43.

Subsequently, the lid body 42 is lowered by the hoisting and lowering mechanism 47 and made to closely contact with the peripheral portion of the mounting portion 41 to form the closed container 40 so that the inside of the closed container 40, that is, the atmosphere in which the wafer W is placed is made the closed atmosphere. Thereafter, the inside of the closed container 40 is sucked by the suction pump 42c through the suction pipe 42b to make an atmosphere therein a reduced-pressure atmosphere of, for example, 13.3 Pa. By virtue of this, the solvent (a thinner) in the resist solution on the wafer W is vigorously volatilized, whereby the surface of the wafer W can be dried in a short time. After the reduced-pressure drying is completed, the inside of the closed container 40 is purged by, for example, dry air, nitrogen gas, or the like through a gas supply pipe which is not shown to recover the pressure therein to the atmospheric pressure, and the wafer W on the mounting portion 41 is transferred to the mounting table 2 in the coating film removing section 20 by the auxiliary arm 5. It should be noted that a temperature control portion is not provided on the mounting portion 41 in this example, but cooling means for maintaining it at a predetermined temperature may be provided or a heating section may be provided so as to heat it at a not-so-high temperature under reduced pressure as in an embodiment described later.

Figure 11:
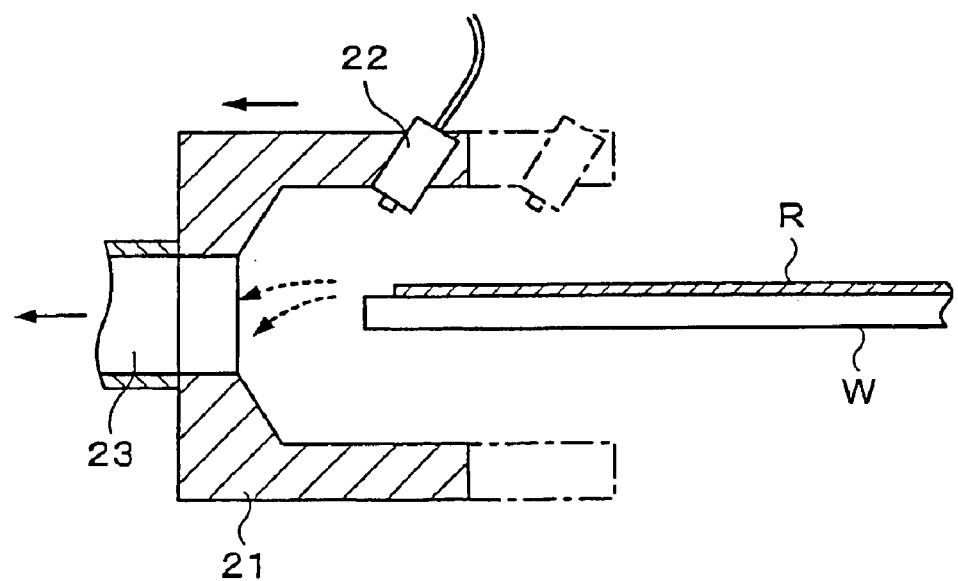
FIG. 11 is an explanatory view showing a manner in which a coating film at a peripheral portion of the wafer is removed in the coating film removing section.

Although the surrounding member 21 is at its retracted position when the wafer W is transferred, the surrounding member 21 advances to surround the peripheral portion of the wafer W when the wafer W is transferred to the mounting table 2 as shown in FIG. 9. Then the solvent is discharged to the peripheral portion of the surface of the wafer W from the solvent nozzles 22 while the wafer W is rotated and at the same time suction is performed from the suction-passing member 23, and the surrounding member 21 is moved to the outside, for example, as shown in FIG. 11. The coating film (the resist film) at the peripheral portion of the wafer W is dissolved by the solvent, and the solvent and the dissolved constituent (the resist constituent) are sucked into the inside of the suction-passing member 23 by the power of blowing the solvent and the sucking action. Incidentally, the surrounding member 21 may not necessarily be slid to the outside during supply of the solvent depending on a degree of extrusion of the coating film from the circuit formation region or the like.

In this manner, after the coating film at the peripheral portion of the wafer W is removed, the main arm MA receives the wafer W on the mounting table 2 and transfers it to, for example, the heating unit 13 corresponding to a post-treatment section to volatilize the still remaining solvent in the coating film there. It should be noted that the heating process may be omitted when the wafer W is sufficiently dried by the reduced-pressure drying section 4. The wafer W after undergoing heat treatment is cooled in the cooling unit 14, subsequently delivered through the delivery section 16 in the shelf unit U4 to the delivery arm 19 in the interface block 17 by the main arm MA, and transferred to the aligner 18 by the delivery arm 19, in which exposure is performed via a mask corresponding to a pattern. The exposed wafer W is delivered to the main arm MA through the delivery arm 19 and the delivery section 16 in the shelf unit U4.

Thereafter, the wafer W is heated to a predetermined temperature, for example, in the heating unit 13, subsequently cooled to a predetermined temperature in the cooling unit 14, and transferred to the developing unit U2 to undergo developing treatment and the resist pattern is formed thereon. After that, the wafer W in the developing unit U2 is taken out, delivered through the delivery section 16 in the shelf unit U3 to the delivery arm 12, and returned to the inside of the cassette C on the cassette mounting section 11.

According to the above-described embodiment, there are effects as follows. That is, there are such effects that yields of the resist solution can be dramatically improved compared with those in a spin coating method since the resist solution is applied on the wafer W in a manner of so-called single stroke by the coating solution nozzle 34, and at the same time that the uniformity in film thickness of the coating film (the solution film of the resist solution) is high since air turbulence caused by the rotation of the wafer W or the like does not occur. In addition, although the solvent which dissolves the resist constituent remains substantially intact in the resist solution on the wafer W, the solvent is rapidly volatilized since it is dried by the reduced-pressure drying section 4. Moreover, if the wafer W is heating-dried with the use of the heating plate, the variation in heat conduction within wafer becomes wide because of a large amount of the solvent as described above, but if the solvent is volatilized under reduced pressure, there is no fear as such and consequently drying can be performed without impairing the uniformity in film thickness of the solution film of the resist solution applied in the coating section 3, whereby it is possible to obtain the coating film (the resist film) which has high uniformity within wafer in film thickness.

Additionally, the reduced-pressure drying section 4 is provided within the coating unit U1, whereby the wafer W after being applied can be transferred to the reduced-pressure drying section 4 without waiting the main arm MA. Since the wafer W after being applied includes the large amount of the solvent, if it is left intact, there is a fear that the within wafer uniformity in film thickness of the solution film is affected by variations in an amount of volatilization due to the non-uniformity in temperatures, but the time that the wafer W is allowed to stand can be shortened according to this embodiment, whereby the high uniformity within wafer in film thickness of the resist film can be obtained also in this respect.

Further, since the coating film removing section 20 is provided within the coating unit U1 so that the coating film at the peripheral portion of the wafer W after undergoing reduced-pressure drying is removed, peeling of the film, which is caused by the adhesion of the resist film to the periphery (an edge portion) of the wafer W, can be prevented. Incidentally, the coating film removing section 20 may be incorporated in the shelf unit U3 (U4) instead of providing it in the coating unit U1. Although the mask 66 is used when the resist solution is applied, the coating solution is applied so far as to the outer side than the circuit formation region (coating film formation region), whereby the resist solution is applied so far as to the almost edge particularly when the circuit formation region is brought close to the periphery of the wafer W. Accordingly, it is effective to provide the coating film removing section 20. Furthermore, the mounting table 2 in the coating film removing section 20 is made to serve as the wafer W delivery section between the coating unit U1 and the main arm MA, which results in space savings compared with when the coating film removing section is separately provided.

(Second Embodiment)

Figure 12:
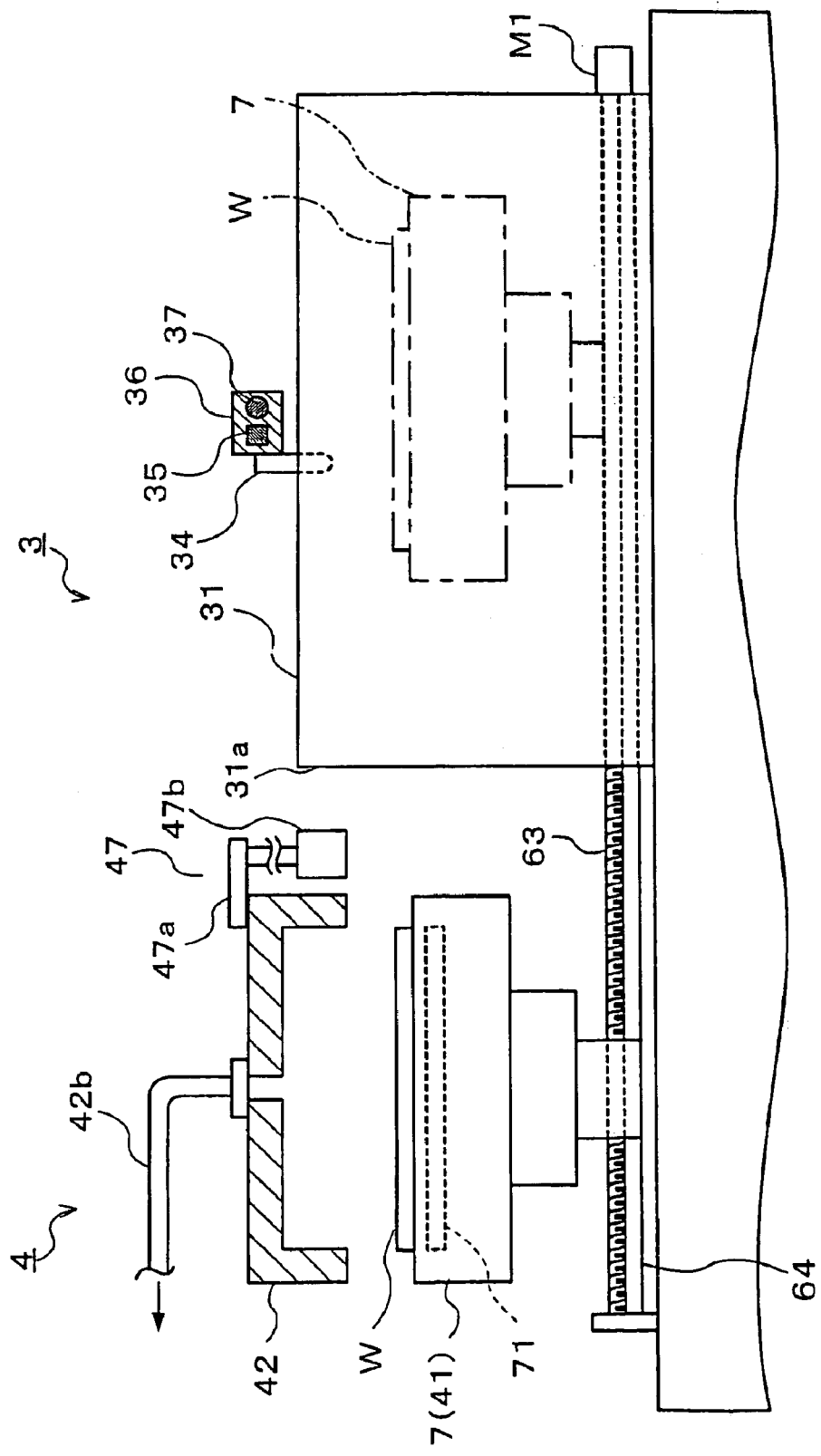
FIG. 12 is a side view showing a coating unit employed in a second embodiment of the present invention.
Figure 13:
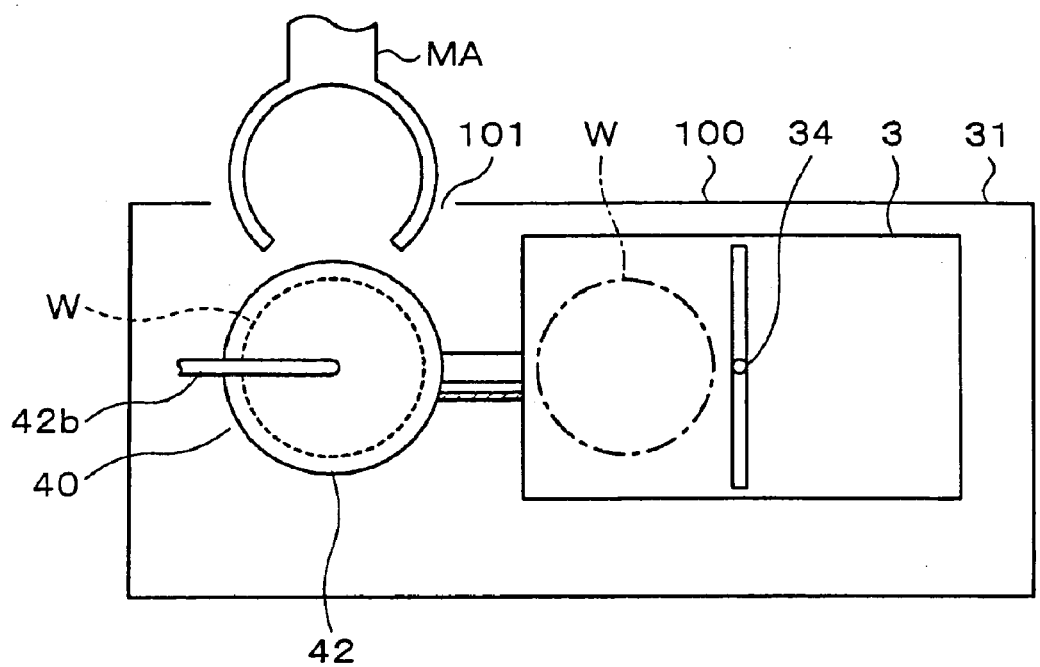
FIG. 13 is a schematic plane view showing the coating unit employed in the second embodiment of the present invention.

This embodiment aims at making the wafer holding portion 6 in the coating section 3 also serve as the mounting portion 41 in the reduced-pressure drying section 4, which are provided in the coating unit U1. FIG. 12 and FIG. 13 is a side view and a plane view respectively showing a coating unit U1 according to a second embodiment. In this example, the numeral representing a wafer holding portion is 7. The ball screw portion 63 and the guide portion 64 for moving the wafer holding portion 7 in the coating section 3 in the Y-direction project from the opening portion 31a of the case body 31 to the outside and extend to an area where drying under reduced pressure is performed. The wafer holding portion 7 is formed as a cylindrical table which is larger than the wafer W in size, and the peripheral portion of the wafer holding portion (mounting portion) 7 is air-tightly joined with the lid body 42 to form a closed container similarly to the mounting portion 41 in the reduced-pressure drying section 4 in the embodiment as already described.

Figure 14:
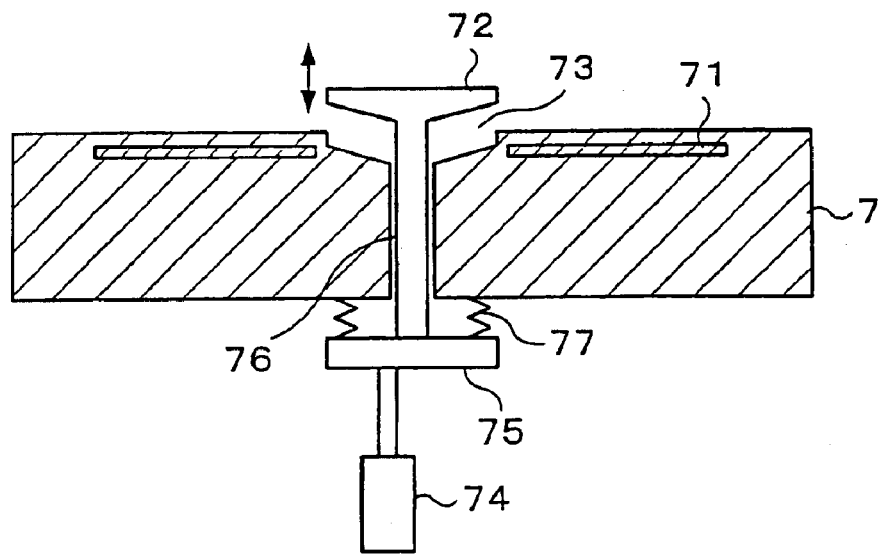
FIG. 14 is a sectional view showing a mounting portion in a reduced-pressure drying section (a holding portion in a coating section) employed in the second embodiment.

Cooling means 71 formed by, for example, a Peltier element which is a temperature control portion is provided under the mounting surface inside the wafer holding portion 7, and it cools the wafer W to a predetermined temperature. In the center part of the wafer holding portion 7, provided is, for example, a lifting stand 72 as shown in FIG. 14. Although the lifting stand 72 is stored inside a recessed portion 73 formed in the mounting surface, it is raised by a hoisting and lowering portion 74 via a hoisting and lowering plate 75 and a hoisting and lowering shaft 76 when the wafer W is received and delivered from/to the main arm MA. Also in this case, bellows 77 are provided between the hoisting and lowering plate 75 and the wafer holding portion 7 in order to maintain an air-tight state inside the closed container 40. In addition, the wafer holding portion 7 also serves as a delivery portion for receiving and delivering the wafer W from/to the main arm MA.

Figure 15:
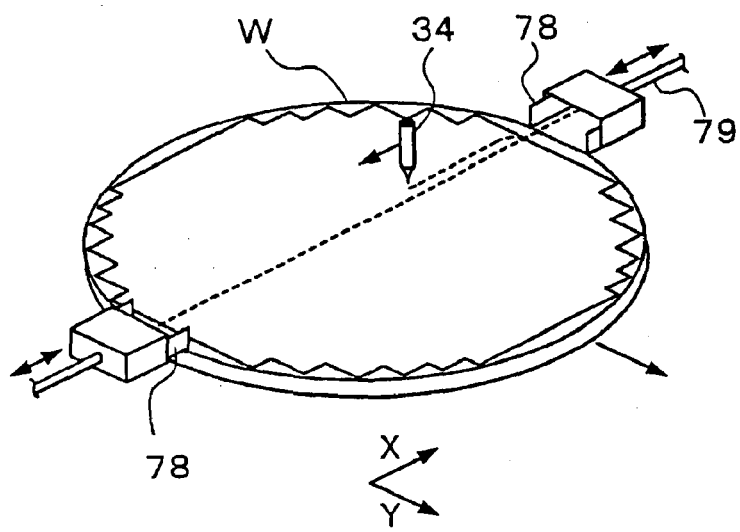
FIG. 15 is a perspective view showing a state where the peripheral portion of the wafer is covered with a mask when the resist solution is applied.

Moreover, as for masks which cover the peripheral portion of the wafer W and are used when the resist solution is applied, masks of the type covering the entire peripheral portion are not employed but masks 78 provided to be opposed to each other in an X-direction, besides having dimensions capable of covering a region of scan of the coating solution nozzle 34 and partially covering the peripheral portion of the wafer W as shown in FIG. 15 are employed. The masks 78 are structured so as to be advanced and retracted in the X-direction by, for example, a supporting member 79 penetrating through the case body 31 and positions thereof in the X-direction are controlled according to a width of a pattern formation region.

In the embodiment like this, the wafer W is delivered from the main arm MA to the wafer holding portion 7 and carried into the case body 31. After the wafer W, which is applied with the resist solution in the coating section 3, is carried to the outside of the case body 31 by the wafer holding portion 7, the lid body 42 is subsequently lowered to make the atmosphere in which the wafer W on the wafer holding portion 7 is placed the closed atmosphere, and the pressure inside the closed container 40 is reduced so that the volatilization of the solvent in the coating solution on the wafer W is promoted and drying processing is performed thereon. Thereafter, the wafer W is delivered from the wafer holding portion 7 to the main arm MA.

By structuring as above, the auxiliary arm 5 for transferring the wafer W between the coating section 3 and the reduced-pressure drying section 4 becomes unnecessary, whereby it is possible to downsize the coating unit U1. Further, the wafer W placed on the wafer holding portion 7 is cooled to the predetermined temperature by the cooling means, which results in the excellent within wafer uniformity in film thickness of the solution film of the resist solution. Incidentally, the above-described coating film removing section 20 may be provided in the coating unit U1 in this example.

(Third Embodiment)

Figure 16:
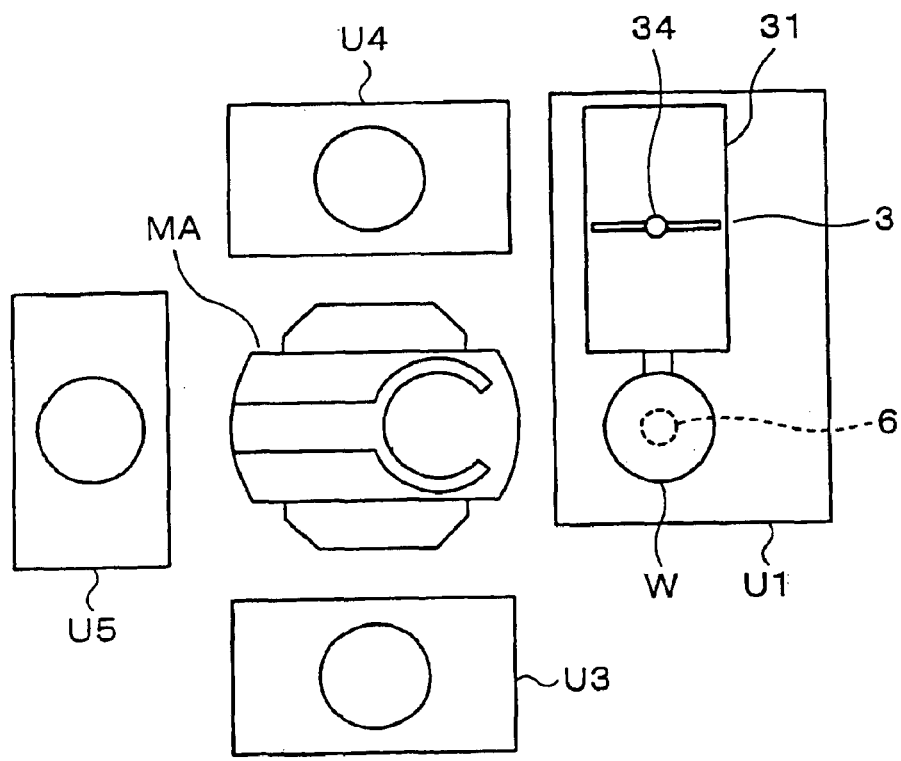
FIG. 16 is a schematic plane view showing processing blocks according to a third embodiment of the present invention.
Figure 17:
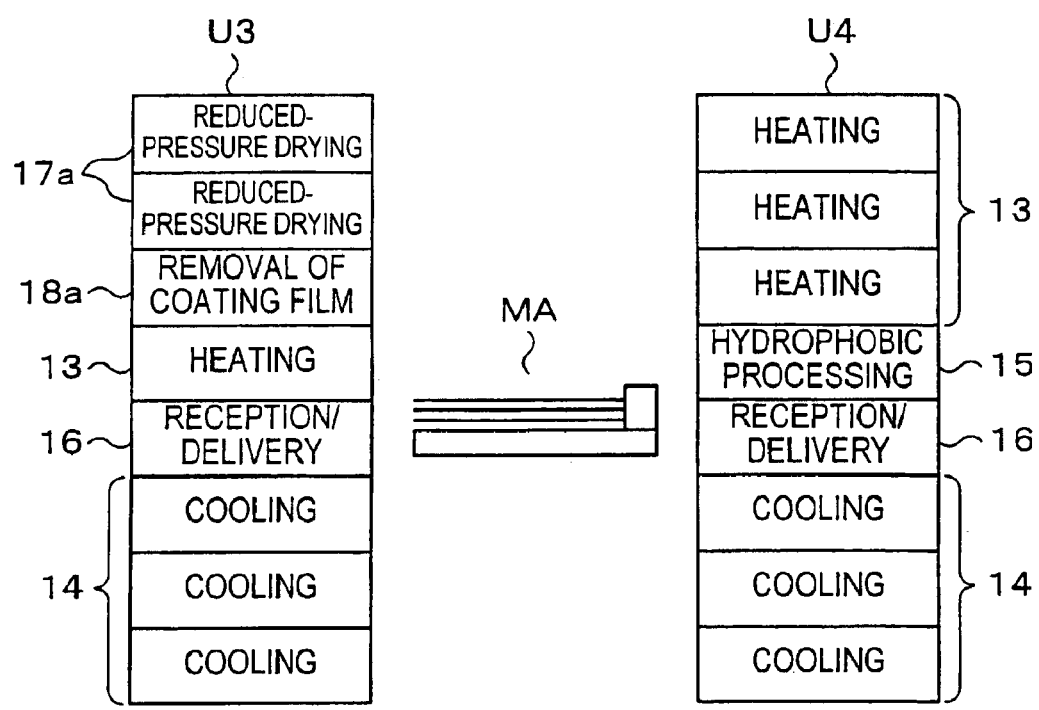
FIG. 17 is a schematic side view showing shelf units according to the third embodiment.

In this embodiment, the reduced-pressure drying sections are not provided in the coating unit U1 but are provided in the shelf unit U3 (U4) as processing units. FIG. 16 and FIG. 17 is a schematic plane view and a schematic side view respectively showing processing blocks of a pattern forming apparatus according to such embodiment, 17a are reduced-pressure drying units, and 18a is a coating film removing unit. Here, an example., in which a shelf unit U5 is added other than the shelf units U3 and U4 in order to reserve numbers of the heating units 13 or the like, is shown. In the coating section 3, the wafer holding portion 6 is structured so as to be carried from the case body 31 to a region of delivery where the wafer W is received and delivered from/to the main arm MA.

Figure 18:
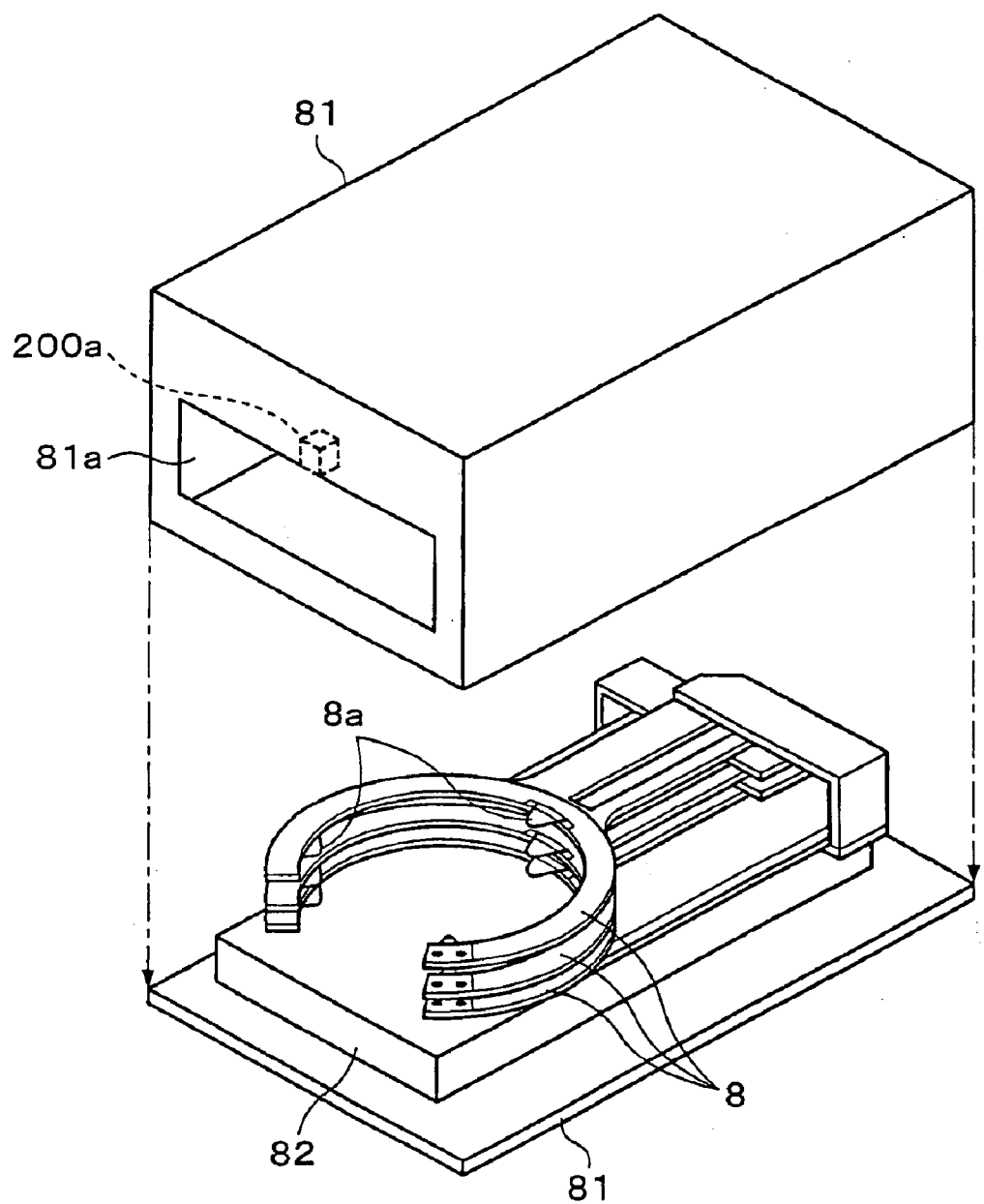
FIG. 18 is a perspective view showing a main transfer mechanism employed in the third embodiment.
Figure 19:
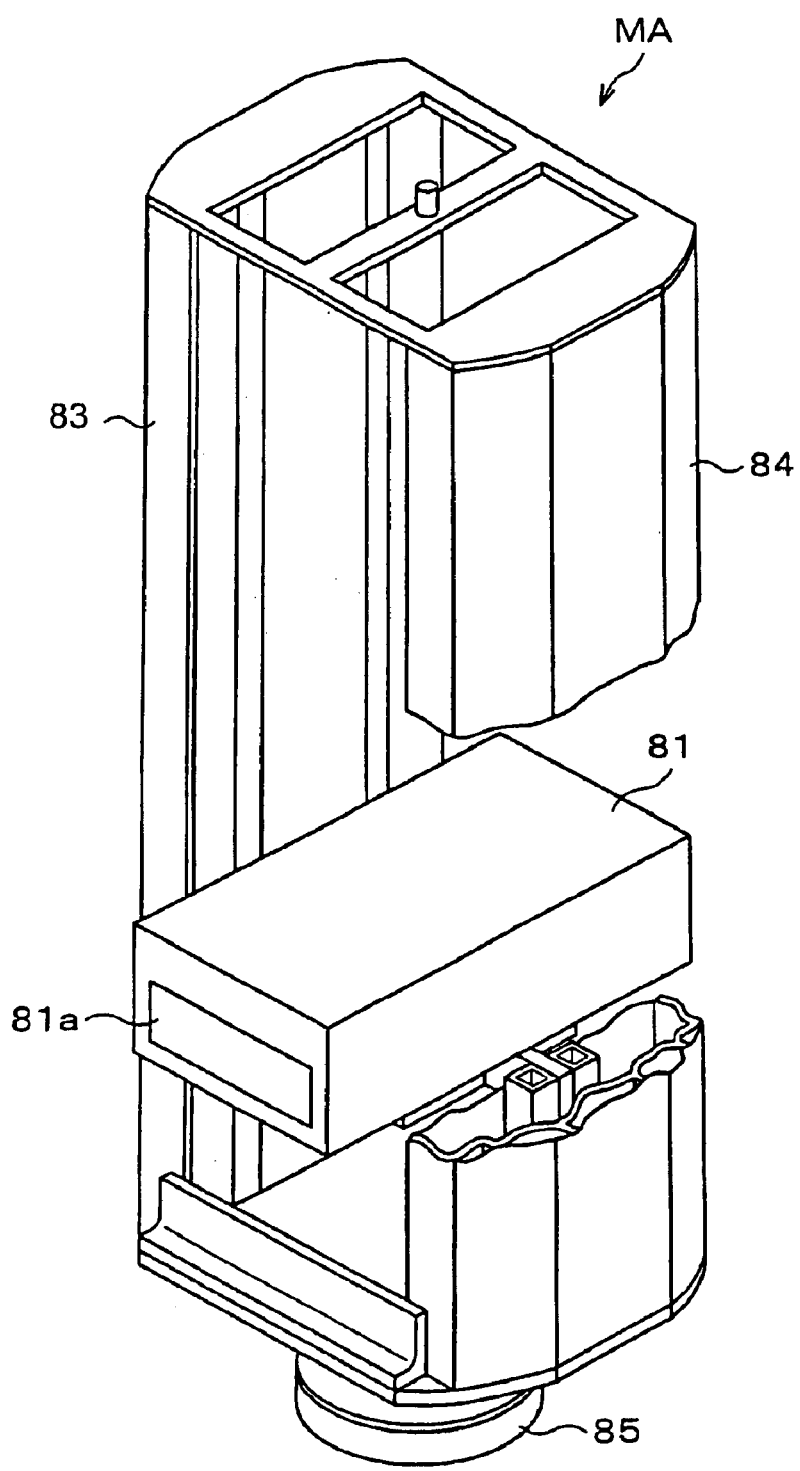
FIG. 19 is an exploded perspective view showing a fragment of the main transfer mechanism.
Figure 20:
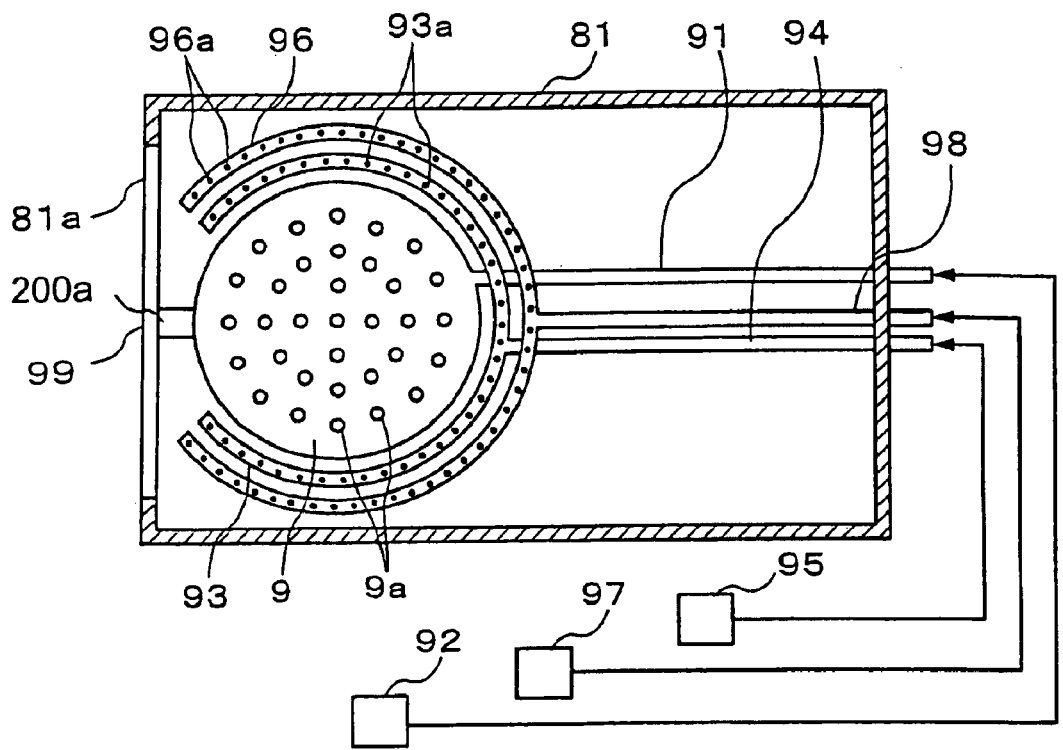
FIG. 20 is a transverse plane view showing a state where the inside of a cover body of the main transfer mechanism is seen from the bottom.
Figure 21:
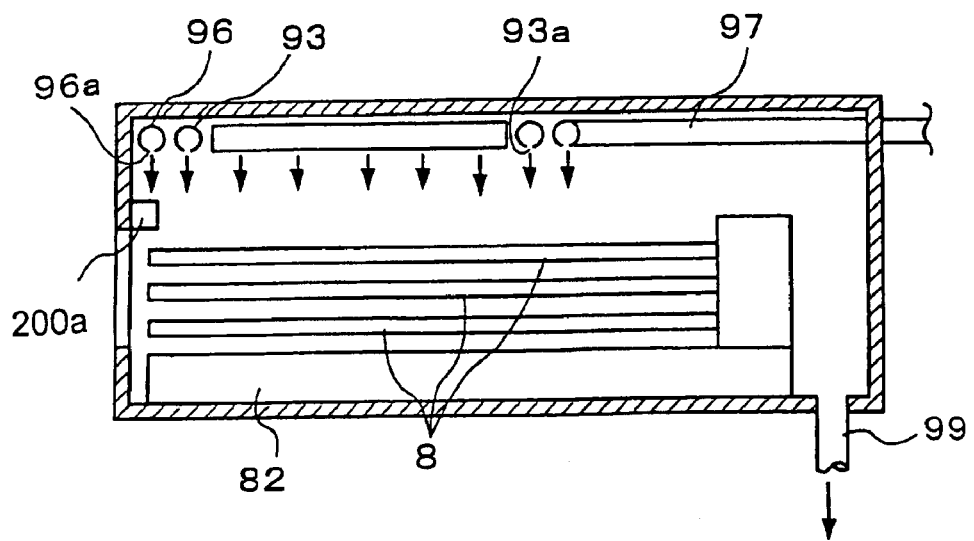
FIG. 21 is a vertical sectional side view showing the inside of the cover body of the main transfer mechanism.

In this embodiment, the wafer W applied with the resist solution is taken out of the coating unit U1 by the main arm MA and transferred to the reduced-pressure drying unit U3, and the main arm MA is so contrived that the volatilization of the solvent in the resist solution is inhibited during the transfer. A structure of this main arm MA will be described hereinafter. The main arm MA is provided with a box-shaped cover body 81 housing arms 8 that are wafer holding members and besides formed with an opening portion 81a on the front surface thereof through which the arms 8 are advanced and retracted as shown in FIG. 18 and FIG. 19. In this cover body 81, housed is a base 82 for supporting, for example, the three arms 8 to be freely advanced and retracted. The respective arms 8 have ring-shaped notch portions of which inner circumferences fit to an outer circumference of the wafer W and projecting portions 8a for holding the peripheral portion of the underneath surface of the wafer W are provided at respective three portions in circumferential directions on the inner circumferences.

The cover body 81 is supported to be freely raised and lowered by a pair of guide rails 83 and 84 which are vertically arranged as shown in FIG. 19, and these guide rails 83 and 84 are structured so as to be rotatable by a rotary drive portion 85, thereby making the arms 8 freely advanced and retracted, freely raised and lowered, and rotatable about a vertical axis.

A shower portion 9 forming solvent vapor supply means is arranged in the cover body 81 to be opposed to the wafer W above the wafer W which is held by, for example, the arms 8 so that the atmosphere in which the wafer W is placed becomes a solvent atmosphere. The shower portion 9 is formed as a venting member provided with a great number of holes 9a, for example, on its underneath surface side, and connected through a gas supply pipe 91 to a gas supply source 92.

Further, in the cover body 81, provided is a solvent supplying member 93 serving as washing solution supply means, which is formed in a ring shape with its one portion notched so as to correspond to shapes of the arms 8 along, for example, an outer circumference of the shower portion 9 and is provided with a great number of holes 93a on its underneath surface side. The solvent supplying member 93 is connected through a solvent supply pipe 94 to a solvent supply source 95. Furthermore, in the cover body 81, a gas for drying supplying member 96 which is formed so as to surround, for example, an outer circumference of the solvent supplying member 93 and is provided with a great number of holes 96a on its underneath surface side. The gas for drying supplying member 96 is connected through an air supply pipe 98 to an air supply source, for example, a warm-air supply source 97. In this example, the solvent supplying member 93 and the gas for drying supplying member 96 form washing means.

To the rear side of the bottom surface of the cover body 81, connected is, for example, a drain pipe 99 for draining the solvent and the dissolved constituent when the arms 8 are washed. In the cover body 81, a CCD camera 200a (a camera in which an image pickup device is employed), which is detecting means for detecting stains of the arms 8, is provided at a position opposed to moving paths of the arms 8, for example, moving paths of the projecting portions 8a at the center of the arms 8, so that an alarm is generated when it is determined by a controller which is not shown that the arms 8 are stained to an extent that they need to be washed based on, for example, image information photographed by the camera 200a.

According to the embodiment like this, since the wafer W is placed in an atmosphere of solvent vapor supplied from the shower portion 9 when the arms 8 in the main arm MA receive the wafer W from the coating unit U1 and retract into the cover body 81, the volatilization of the solvent from the solution film of the resist solution is inhibited and the variations in the amount of volatilization within wafer become small as described above, thereby maintaining the uniformity in film thickness of the solution film. Although the solvent vapor may be continuously supplied to the inside of the cover body 81 or may be supplied slightly before the arms 8 move to the coating unit U1 to receive the wafer W, it is made to be supplied at least while the wafer W is transferred.

Additionally, for example, if the resist solution spreads from the periphery of the wafer W to the back surface thereof to adhere to the projecting portions of the arms 8 and the alarm is generated via the CCD camera 200a when an amount of the adhesion excesses a given amount, the solvent (a thinner solution) is supplied from the solvent supplying member 93 to, for example, inner peripheral portions of the arms 8 by a direction from an operator or the controller to dissolve and remove the film of the hardened resist solution. Subsequently, gas for drying such as, for example, warm air is blown from the gas for drying supplying member 96 against the arms 8 to dry the arms 8 and the washing process is completed. In this manner, washing of the main arm MA is made easy by providing the washing means in the main arm MA.

It should be noted that a shutter for opening and closing the opening portion 81a may be provided on the cover body 81 so that the shutter is closed after the arms 8 are retracted. Moreover, gas such as, for example, air which is controlled in at least either temperature or humidity may be supplied from the gas supplying member to the inside of the cover body 81 in place of the supply of the solvent vapor, and also in this case the volatilization of the solvent vapor from the wafer W can be inhibited by controlling the temperature or the humidity inside the cover body 81 to a predetermined value. Such gas supplying member and the solvent supplying member 93 compose atmosphere forming means for forming the atmosphere in which the solvent vapor inside the cover body 81 is inhibited from volatilizing, and the atmosphere forming means may be formed only by the cover body 81.

(Fourth Embodiment)

Figure 22:
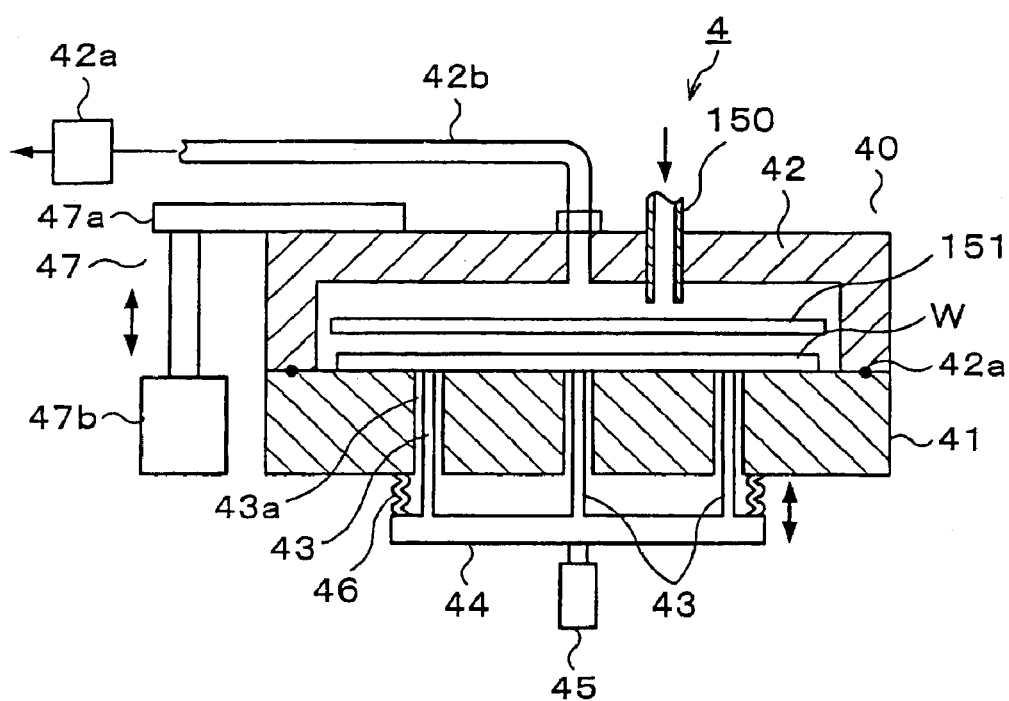
FIG. 22 is a sectional view showing a reduced-pressure drying section provided in a resist coating unit according to a fourth embodiment.

In this embodiment, there is a structure in which solvent vapor of the resist solution can be supplied to the inside of the reduced-pressure drying section 4 provided in the coating unit U1. Hereinafter, a structure of the reduced-pressure drying section 4 in this embodiment will be described. As shown in FIG. 22, a solvent vapor supply pipe 150 for supplying the solvent vapor of the resist solution to the inside of the reduced-pressure drying section 4 is connected to the upper surface of the lid body 42. Additionally, inside the reduced-pressure drying section 4, a baffle 151 with an appropriate space from the wafer W is arranged above the wafer W placed on the mounting portion 41. The other structures are the same as those in the first embodiment illustrated above by using FIG. 5 or the like, and there is a structure that the atmosphere in which the wafer W is placed can be made the closed atmosphere by air-tightly joining the lid body 42 with the peripheral portion of the mounting portion 41 via the O-rings 42*a*.

Moreover, the lifting pins 43 are provided through the mounting portion 41 so as to be raised and lowered by the hoisting and lowering portion 45 via the hoisting and lowering plate 44, and the bellows 46 are provided between the peripheral portion of the hoisting and lowering plate 44 and the mounting portion 41. Further, one end portion of the suction pipe 42*b* is connected to the central portion of the lid body 42, and the pressure inside the closed container 40 can be reduced by the suction pump 42*c*. The lid body 42 is raised and lowered by the hoisting and lowering mechanism 47 and the hoisting and lowering mechanism 47 is formed by the hoisting and lowering arm 47*a* attached on the lid body 42, the drive portion 47*b* for operating the hoisting and lowering arm 47*a*, and the like.

In the embodiment like this, the wafer W, which is applied with the resist solution in the coating section 3, is transferred on the mounting portion 41 in the reduced-pressure drying section 4 by the auxiliary arm 5 as described above. Transferring the wafer W to the mounting portion 41 in this manner is performed by making the lifting pins 43 project from the mounting portion 41 in advance, delivering the wafer W thereon from the arm 54, and lowering the lifting pins 43.

Subsequently, the lid body 42 is lowered by the hoisting and lowering mechanism 47 and made to closely contact with the peripheral portion of the mounting portion 41 to form the closed container 40 so that the inside of the closed container 40, that is, the atmosphere in which the wafer W is placed is made the closed atmosphere.

Then, the solvent vapor of the resist solution is initially supplied to the inside of the reduced-pressure drying section 4 from the solvent vapor supply pipe 150 connected to the upper surface of the lid body 42. At this time, the solvent vapor of the resist solution supplied from the solvent vapor supply pipe 150 reaches the top surface of the wafer W applied with the resist solution after bypassing the baffle 151, whereby the solvent vapor of the resist solution supplied from the solvent vapor supply pipe 150 is not directly blown against the top surface of the wafer W and the solvent vapor of the resist solution can be uniformly supplied to the entire top surface of the wafer W. In this manner, the resist solution, which is applied in a manner of so-called single stroke in the coating section 3 as described above, can be spread over the entire top surface of the wafer W by initially maintaining the reduced-pressure drying section 4 in the atmosphere of the solvent vapor, whereby it is possible to even the solution film to improve the uniformity in film thickness.

Thereafter, supply of the solvent vapor of the resist solution from the solvent vapor supply pipe 150 is brought to a stop and the inside of the closed container 40 is sucked by the suction pump 42*c* so that the reduced-pressure atmosphere is generated therein. By virtue of this, the solvent (the thinner) in the resist solution on the wafer W is vigorously volatilized, enabling the surface of the wafer W to be dried in a short time.

According to this embodiment, the resist solution, which is applied in a manner of so-called single stroke in the coating section 3, is spread over the entire top surface of the wafer W under the atmosphere of the solvent vapor, thereby making it possible to improve the uniformity (leveling) in film thickness.

It should be noted that it is preferable to provide the baffle 151 between the top surface of the wafer W placed on the mounting portion 41 when the solvent vapor is supplied from the upper surface of the lid body 42. In that case, it is desirable that the space between the top surface of the wafer W and the baffle is controlled if necessary to have a distance in which the solvent vapor can uniformly flow to the top surface of the wafer W.

Further, it is not limited that the solvent vapor is supplied from the upper surface of the lid body 42, but it may be supplied from the lower portion or the side thereof to the inside of the reduced-pressure drying section 4, and directions of supply may be combined if necessary. Furthermore, it may be structured that the solvent vapor is supplied from the entire underneath surface of the baffle 151 arranged above the wafer W to the top surface of the wafer W.

(Fifth Embodiment)

Figure 23:
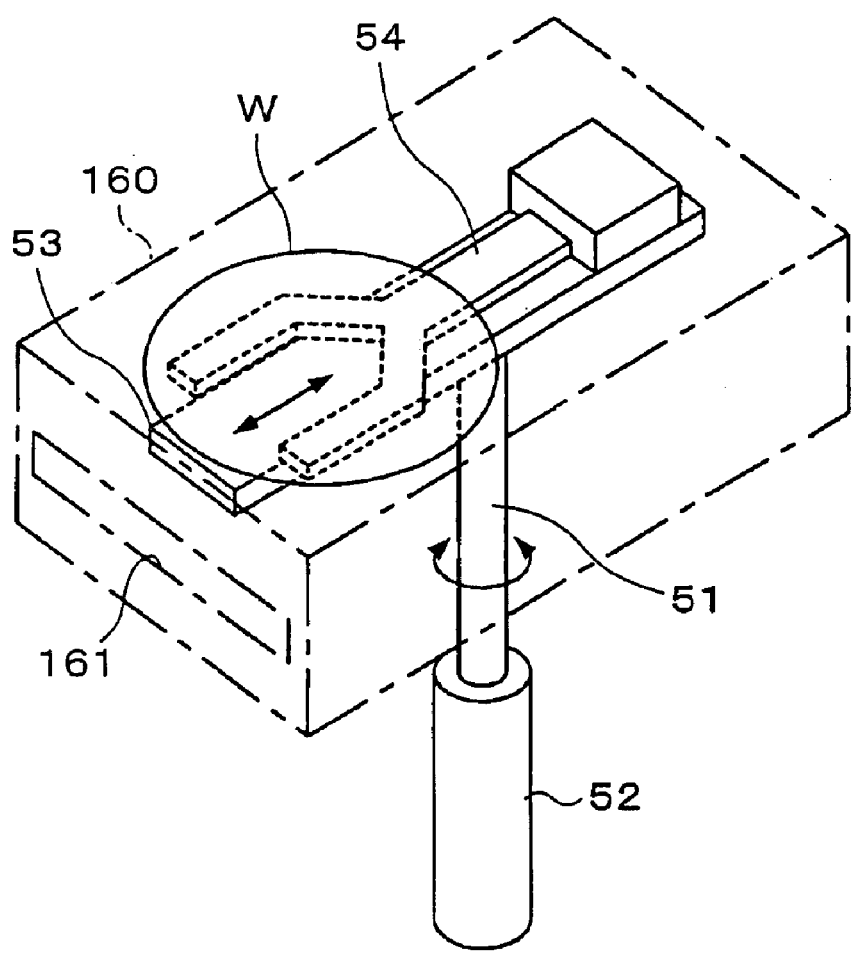
FIG. 23 is a perspective view showing a structure of an auxiliary transfer mechanism in a pattern forming apparatus according to a fifth embodiment.

This embodiment has a structure where the wafer W, which is applied with the resist solution in the coating section 3 as described above, can be placed under the atmosphere of the solvent vapor of the resist solution while it is transferred to the reduced-pressure drying section 4 by the auxiliary arm 5. A structure of the auxiliary arm 5 in this embodiment will be described hereinafter. The structure of the auxiliary arm 5 itself (see FIG. 23) is mostly similar to that in the first embodiment illustrated by FIG. 5 or the like, and the auxiliary arm 5 is provided with the drive portion 52 for raising, lowering, and rotating about the vertical axis the driving shaft 51, the base 53 provided on the upper portion of the driving shaft 51, and the arm 54 freely advanced and retracted along the base 53.

Incidentally, a casing 160 having dimensions capable of housing the wafer W is fitted around the base 53 and the arm 54 which are attached above the driving shaft 51 in the auxiliary arm 5 in this embodiment. The casing 160 is raised, lowered, and rotated about the vertical axis integrally with the base 53 and the arm 54 by operation of the drive portion 52. Moreover, an opening portion 161 having dimensions capable of passing the wafer W is formed on the front surface of the casing 160. Besides, solvent vapor supply means which is not shown for supplying the solvent vapor of the resist solution is provided in the casing 160.

In such embodiment, the wafer W, which is applied with the resist solution in the coating section 3 as described above, is taken out of the coating section 3 by the arm 54 of the auxiliary arm 5. Then, in accordance with retraction of the arm 54 into the casing 160, the wafer W is passed through the opening portion 161 and housed inside the casing 160. The inside of the casing 160 is maintained under the atmosphere of the solvent vapor by the solvent vapor supply means (not shown) and the solvent vapor of the resist solution is uniformly supplied to the entire top surface of the wafer W housed in the casing 160 in this manner. Thus, the resist solution, which is applied in a manner of so-called single stroke in the coating section 3 as described above, can be spread over the entire top surface of the wafer W by maintaining the inside of the casing 160 under the atmosphere of the solvent vapor, whereby it is possible to even the solution film to improve the uniformity in film thickness.

After that, in accordance with projection of the arm 54 from the casing 160, the wafer W is passed through the opening portion 161, taken out of the casing 160 and transferred on the mounting portion 41 in the reduced-pressure drying section 4. Subsequently, the lid body 42 is lowered to form the closed container 40 and the inside of the closed container 40 is sucked by the suction pump 42c so that the reduced-pressure atmosphere is generated therein. This allows the surface of the wafer W to be dried in a short time.

According to this embodiment, the resist solution applied in a manner of so-called single stroke in the coating section 3 is spread over the entire top surface of the wafer W under the atmosphere of the solvent vapor while the wafer W is transferred to the reduced-pressure drying section 4 by the auxiliary arm 5, thereby making it possible to improve the uniformity (leveling) in film thickness.

It should be noted that a shutter may be provided on the opening portion 161 on the front surface of the casing 160 so that the shutter is closed when the wafer W is retracted into the casing 160. As a result, the wafer W can be maintained in the closed atmosphere inside the casing 160, whereby it is possible to stably hold the wafer W under the atmosphere of the solvent vapor.

(Sixth Embodiment)

Figure 24:
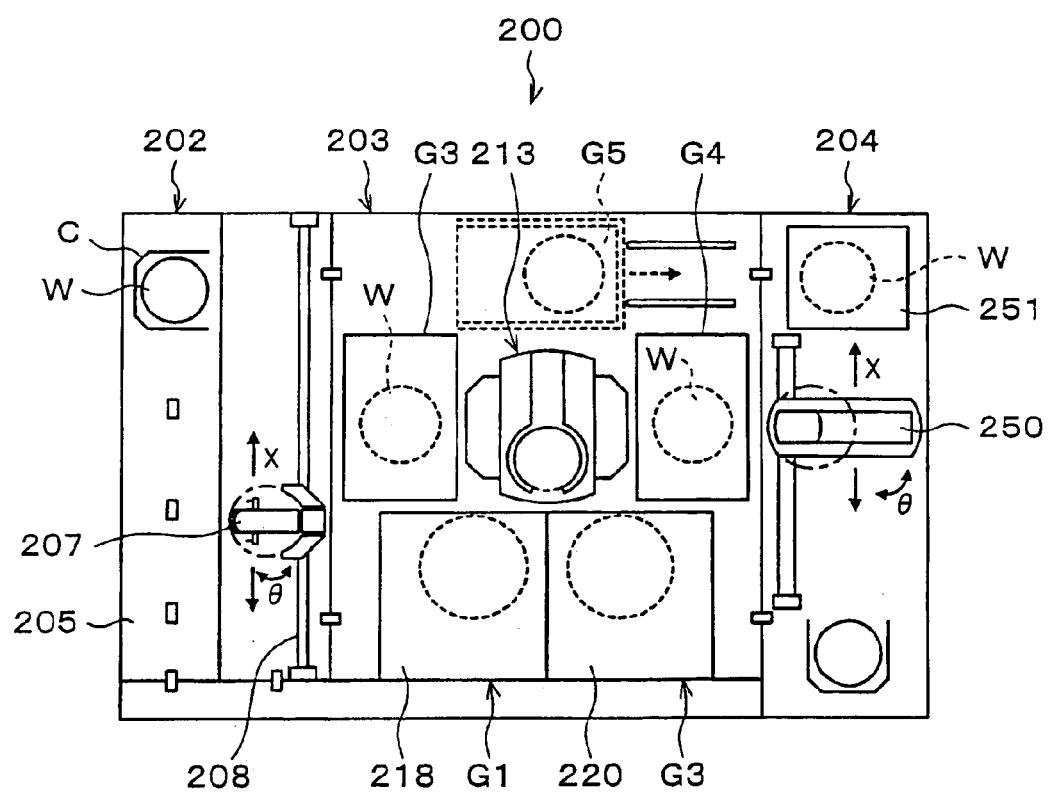
FIG. 24 is a plane view showing an appearance of a coating and developing system provided with a resist coating unit according to a sixth embodiment.
Figure 25:
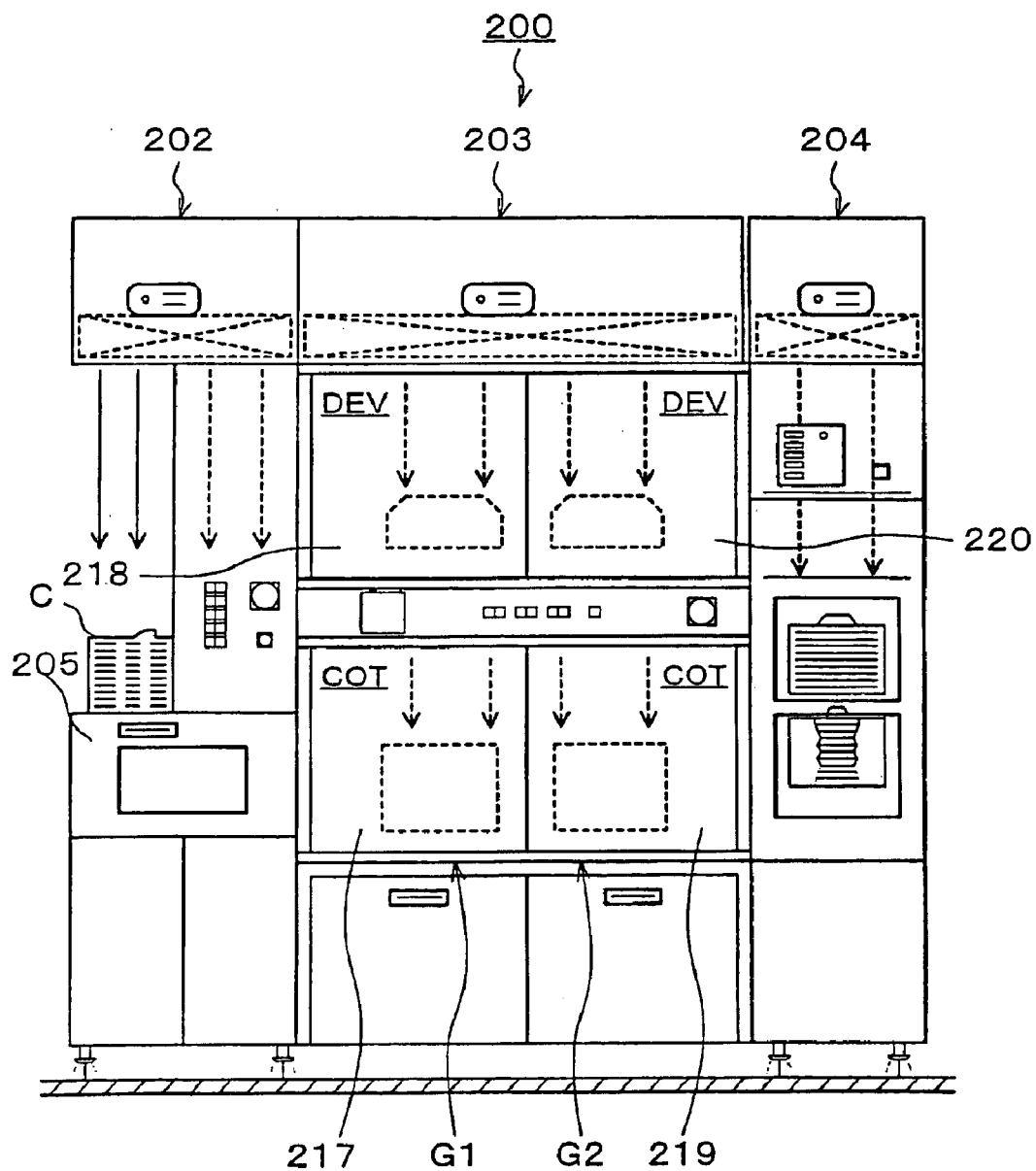
FIG. 25 is a front view of the coating and developing system in FIG. 24.
Figure 26:
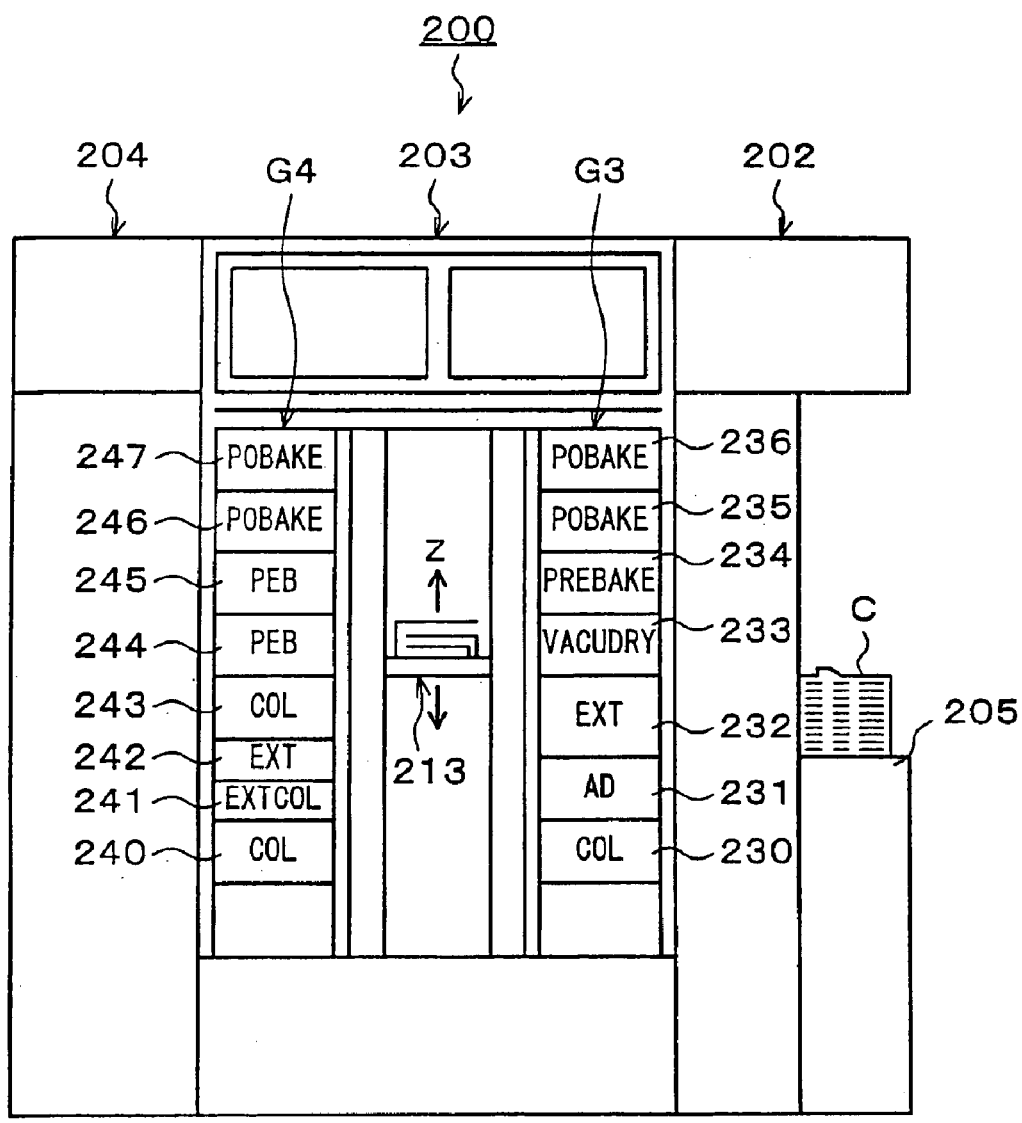
FIG. 26 is a rear view of the coating and developing system in FIG. 24.
Figure 27:
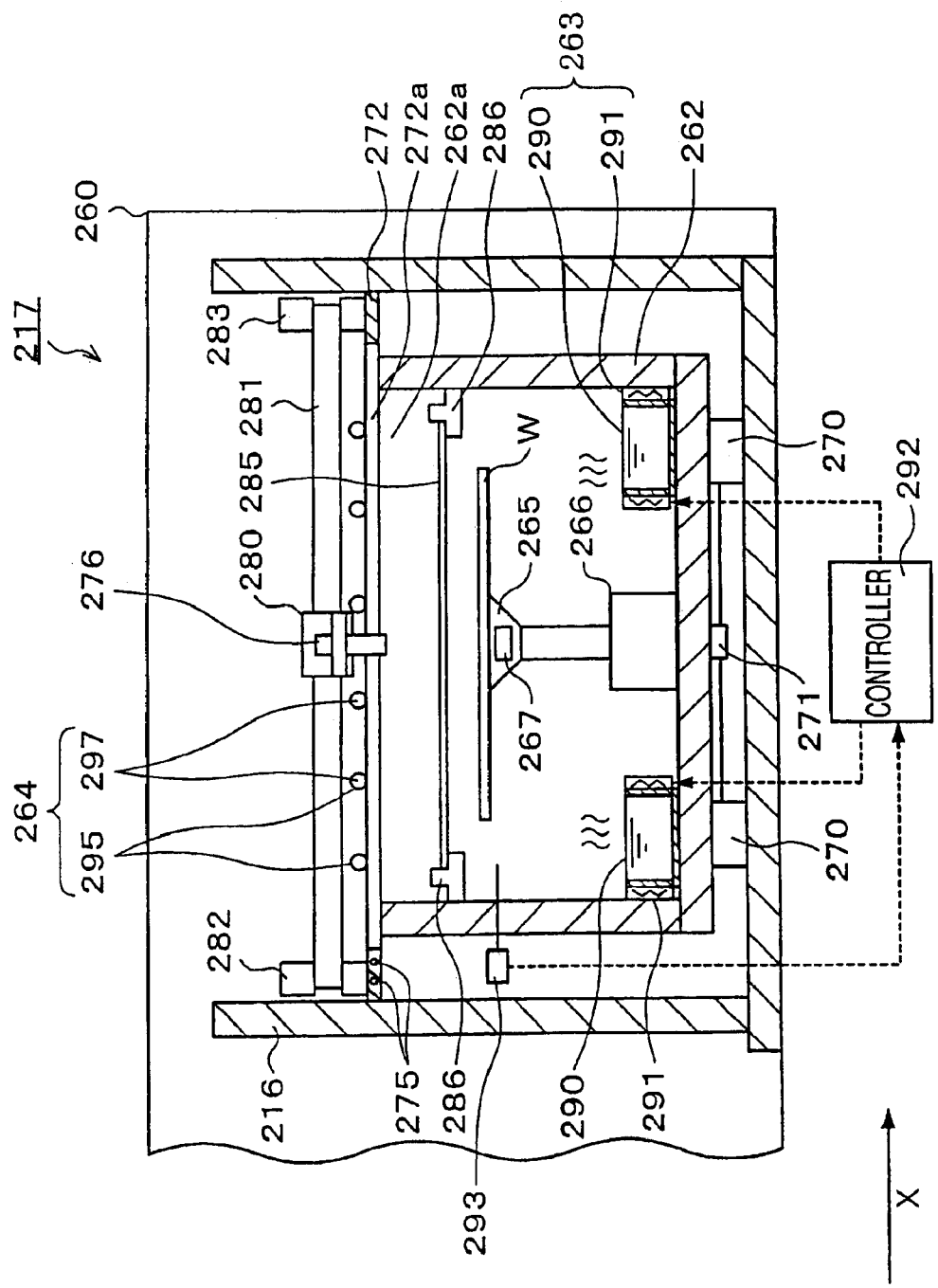
FIG. 27 is an explanatory view of a vertical section of a resist coating unit according to present embodiments.
Figure 28:
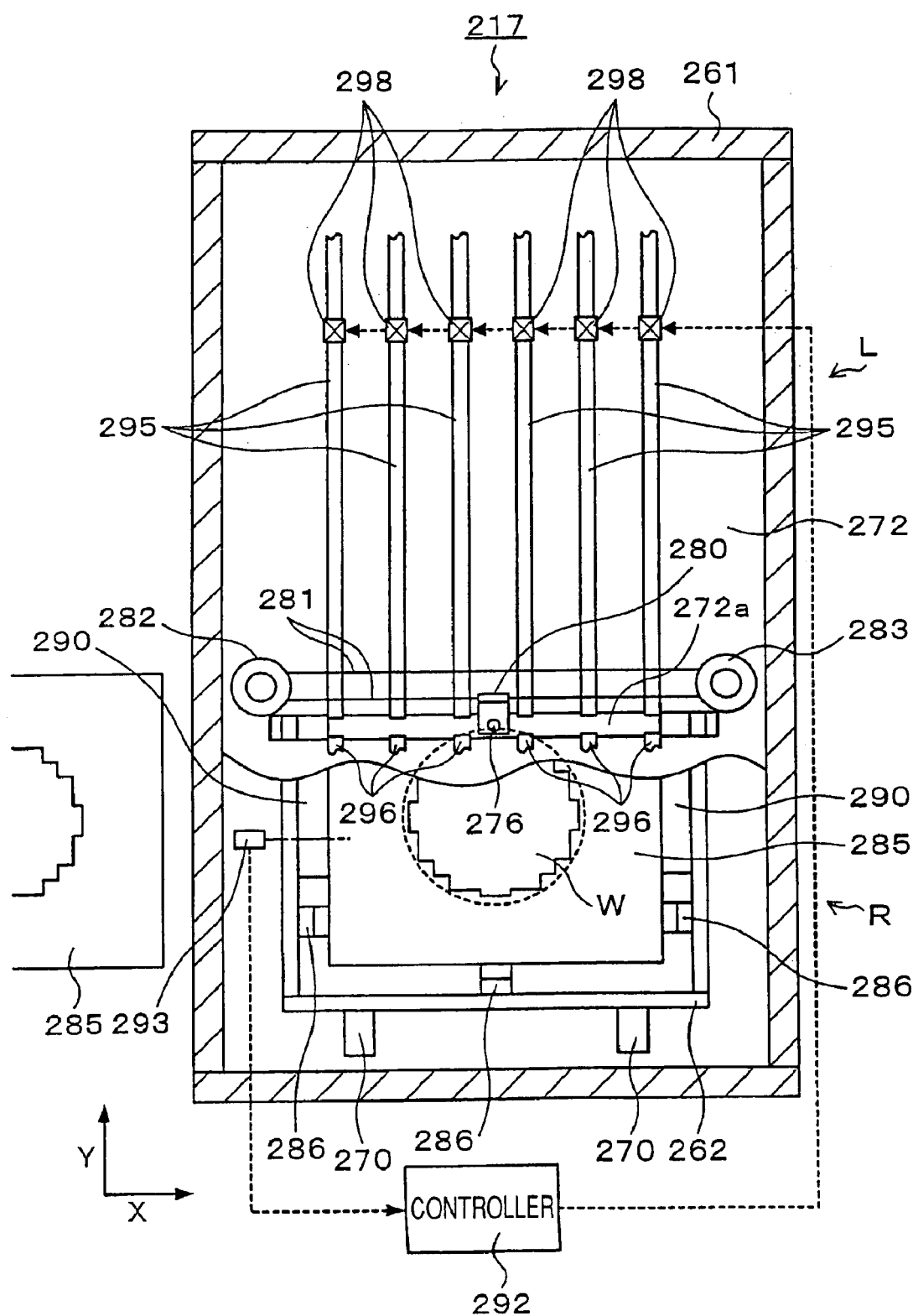
FIG. 28 is an explanatory view of a transverse section of the resist coating unit according to the present embodiments.

Next, a resist coating unit according to embodiments of the present invention will be explained. FIG. 24 is a plane view of a coating and developing system (a pattern forming system) 200 having the resist coating unit according to the present embodiment, FIG. 25 is a front view of the coating and developing system 200, and FIG. 26 is a rear view of the coating and developing system 200.

As shown in FIG. 24, the coating and developing system 200 has a structure in which a cassette mounting section 202 for carrying, for example, 25 wafers from/to the outside to/from the coating and developing system 200 in the unit of cassette and for carrying the wafers W into/from a cassette C, a processing station 203 in which various kinds of multi-tiered processing units for performing predetermined processing one by one in the coating and developing process are disposed, and an interface block 204 for receiving and delivering the wafer W from/to an aligner which is not shown provided adjacent to the processing station 203, are integrally connected.

In the cassette mounting section 202, a plurality of cassettes C are well mounted at predetermined positions on a cassette mounting table 205 serving as a mounting section in a line in an X-direction (a vertical direction in FIG. 24). Further, a delivery arm 207, which is transferable in the direction of alignment of the cassettes (the X-direction) and in the direction of alignment of the wafers W housed in the cassette C (a Z-direction; a vertical direction), is provided to be movable along a carrier guide 108 and is selectively accessible to the respective cassettes C.

The delivery arm 207 has an alignment function for aligning the wafer W. The delivery arm 207 is structured so as to access also an extension unit 232 included in a third processing unit group G3 on the side of the processing station 203 as will be described later.

In the processing station 203, a main arm 213 is provided in the center part thereof, and various kinds of processing units are multi-tiered on the periphery of the main arm 213 to compose processing unit groups. In the coating and developing system 200, there are four processing unit groups G1, G2, G3 and G4, and the first and the second processing unit groups G1, G2 are disposed on the front side of the coating and developing system 200, the third processing unit group G3 is disposed adjacent to the cassette mounting section 202, and the fourth processing unit group G4 is disposed adjacent to the interface block 204. Further, as an option, a fifth processing unit group G5 depicted by broken lines can be additionally arranged on the rear side of the coating and developing system 200. The main arm 213 is capable of carrying the wafers W into/from the various kinds of processing units arranged in these processing unit groups G1 to G5 described later.

In the first processing unit group G1, for example, a resist coating unit 217 according to this embodiment and a developing unit 218 for performing treatment on the wafer W with a developing solution supplied are two-tiered in the order from the bottom as shown in FIG. 25. Also in the case of the second processing unit group G2, a resist coating unit 219 and a developing unit 220 are similarly two-tiered in the order from the bottom.

In the third processing unit group G3, for example, as shown in FIG. 26, a cooling unit 230 for cooling the wafer W, an adhesion unit 231 for increasing the fixability between the resist solution and the wafer W, the extension unit 232 for keeping the wafer W waiting, a vacuum drying unit 233 for drying the solvent in the resist solution under reduced pressure, prebaking unit 234, postbaking units 235, 236 for performing heat treatment after developing treatment and so on are, for example, seven-tiered in the order from the bottom.

In the fourth processing unit group G4, for example, a cooling unit 240, an extension and cooling unit 241 for spontaneously cooling the placed wafer W, an extension unit 242, a cooling unit 243, post-exposure baking units 244, 245 for performing heat treatment after exposure processing, postbaking units 246, 247 and so on are, for example, eight-tiered in the order from the bottom.

In the center part of the interface block 204, provided is a wafer transfer arm 250. The wafer transfer arm 250 is structured so as to be movable in the X-direction (the vertical direction in FIG. 24) and the Z-direction (the vertical direction), and to be rotatable in a θ direction (a rotational direction about an axis Z), so that it can access the extension and cooling unit 241, the extension unit 242 which are included in the fourth processing unit group G4, a peripheral aligner 251, and the aligner which is not shown.

Next, a structure of the above-described resist coating unit 217 will be explained. Here, a resist coating unit, which is capable of performing a coating method of so-called single stroke where resist solution discharge means for discharging the resist solution applies the resist solution to the wafer W while relatively moving, is employed.

In a casing 260 in the resist coating unit 217, provided is a substantially box-shaped outer container 261 of which length is large in a Y-direction (a vertical direction in FIG. 28) as shown in FIGS. 27 to 30, and the outer container 261 has its upper surface opened. In the outer container 261, provided is an inner container 262 for performing treatment on the wafer W therein. The inside of the inner container 262 is supplied with solvent vapor by solvent-atmosphere generating means 263 to be filled with a solvent atmosphere at a predetermined concentration, and besides the solvent atmosphere is sucked by intake means 264 according to the present invention.

In the inner container 262, provided is a mounting table 265 for suction-holding the wafer W, and a rotary hoisting and lowering drive mechanism 266 for freely rotating, raising and lowering the mounting table 265 is provided thereunder. Additionally, for example, an ultrasonically vibrating element 267 is attached to the mounting table 265 and can vibrate the mounting table 265 at high frequency.

Figure 29:
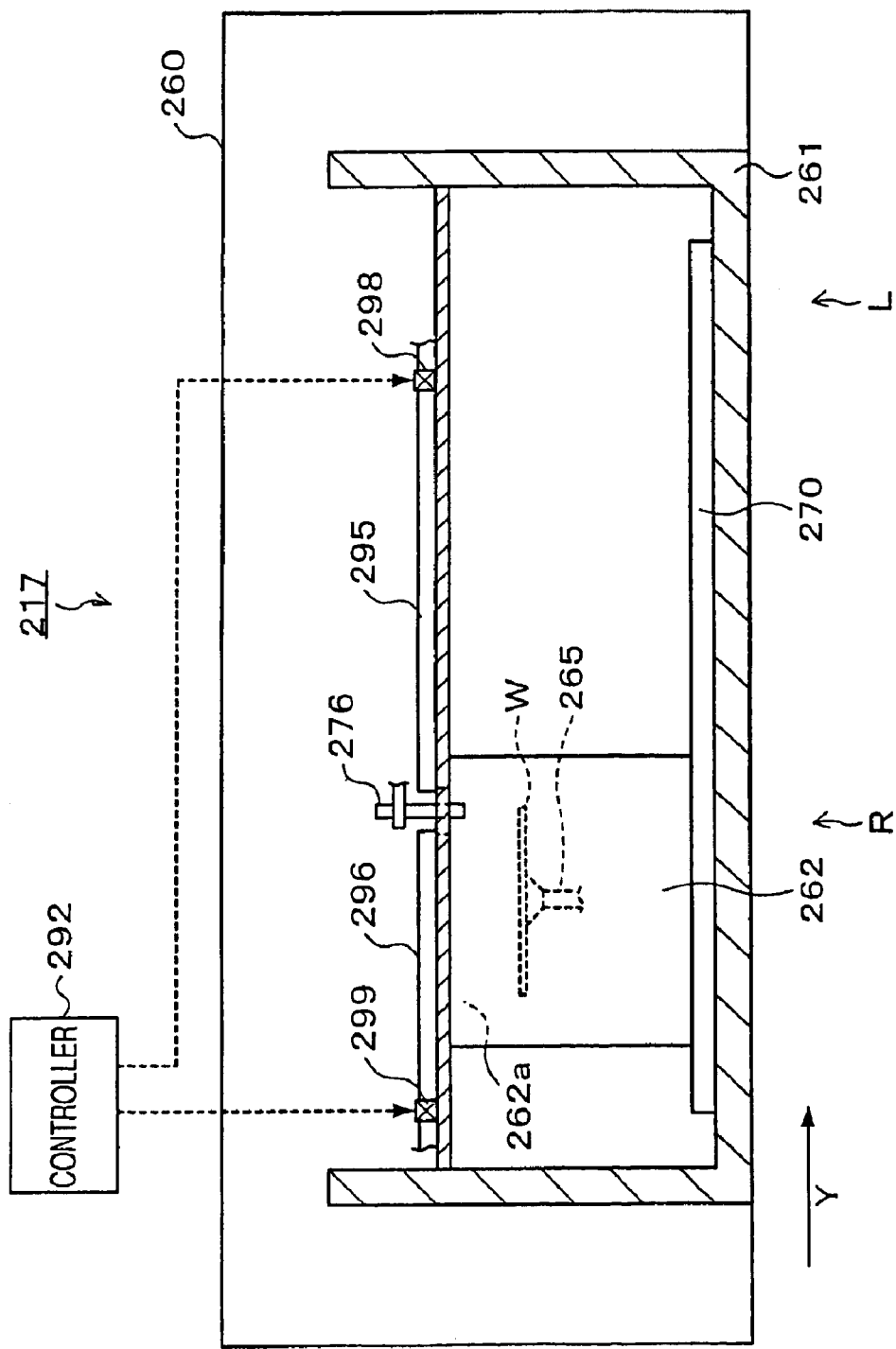
FIG. 29 is an explanatory view of the resist coating unit according to the present embodiments seen from the side, showing a manner in which a resist coating is performed.
Figure 30:
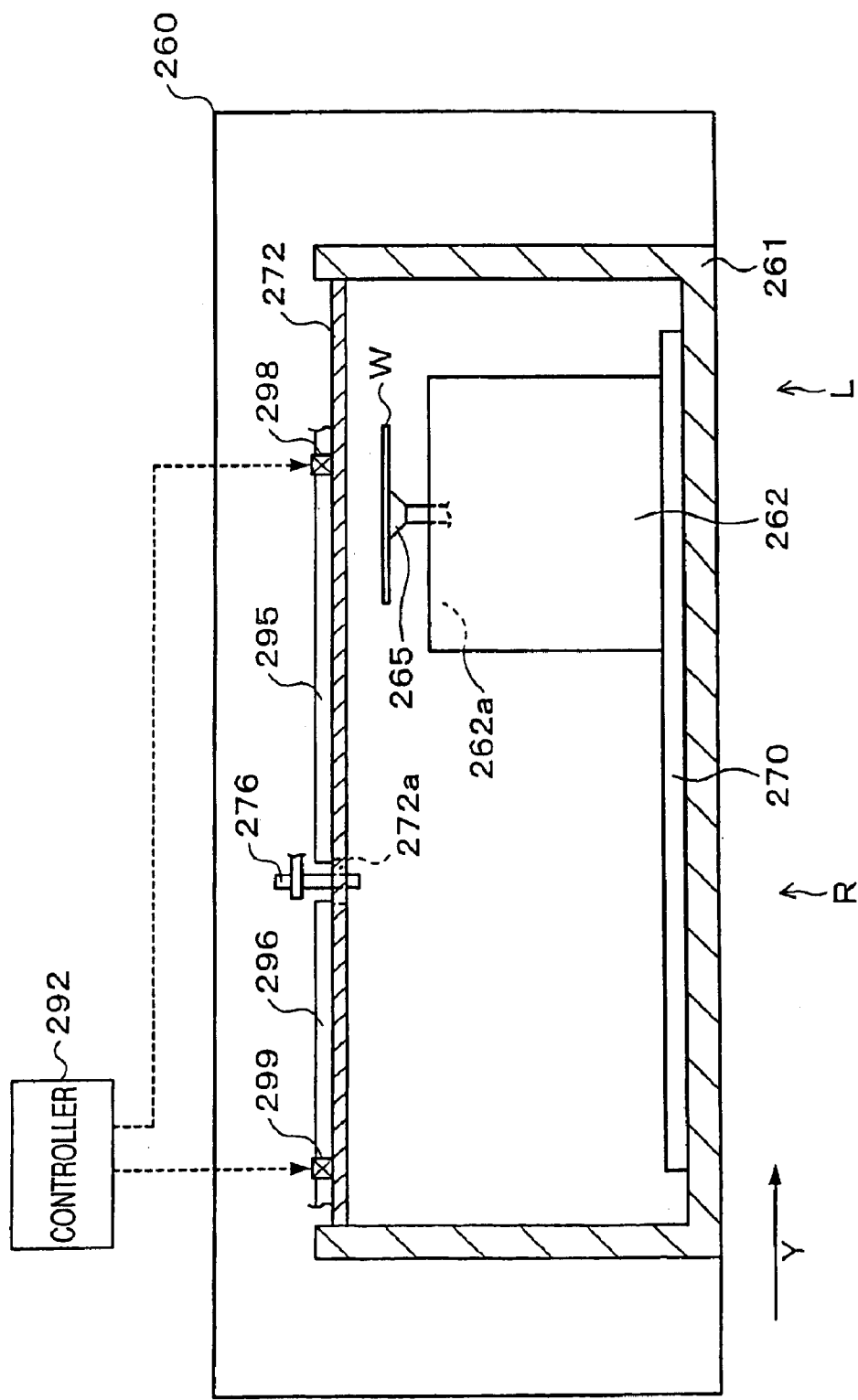
FIG. 30 is an explanatory view of the resist coating unit according to the present embodiments seen from the side, showing a manner in which carrying in/out of the wafer is performed.

The inner container 262 is structured so as to be movable by an inner container drive mechanism 271 on two rails 270 provided on the bottom surface of the outer container 261 and extending in the Y-direction. Further, a cover 272 for opening and closing a carrier inlet/outlet 262a formed on the upper surface of the inner container 262 is provided. The cover 272 is freely raised and lowered by a hoisting and lowering mechanism which is not shown. Accordingly, when the wafer W is carried into/from the inner container 262, the inner container 262 is moved to a transfer section L on the plus direction side in a Y-direction (the right side in FIG. 30) in the outer container 261 and at the same time the cover 272 is raised by the hoisting and lowering mechanism to open the carrier inlet/outlet 262a as shown in FIG. 30. Then the mounting table 265 is raised upward in the inner container 262 by the rotary hoisting and lowering drive mechanism 266. If the main arm 213 enters the casing 260 in this state, the wafer W can be received and delivered from/to the mounting table 265. On the other hand, when coating treatment is performed on the wafer W, the inner container 262 is moved to a treatment section R on the minus direction side in the Y-direction (the left side in FIG. 29) in the outer container 261 and at the same time the cover 272 is lowered by the hoisting and lowering mechanism to close the carrier inlet/outlet 262a so that the inside of the inner container 262 is easily maintained under a predetermined atmosphere as shown in FIG. 29. Further, the inner container 262 can be moved a predetermined distance in the Y-direction at predetermined timing by the inner container drive mechanism 271 while the resist solution is applied to the wafer W.

A heating element 275 capable of controlling temperature is embedded in the cover 272 and prevents the solvent atmosphere in the inner container 262 described later from condensing on the underneath surface of the cover 272. Moreover, in the cover 272, provided are a slit 272a extending in an X-direction and a discharge nozzle 276 moving in the slit 272a in the X-direction. The discharge nozzle 276 is capable of discharging the resist solution to the wafer W therebelow. Additionally, the discharge nozzle 276 is fixed to a holder 280, and the holder 280 is attached to a timing belt 281 extending in the X-direction. The timing belt 281 is looped between pulleys 282 and 283 provided on the cover 272, and the pulley 282 is rotated in normal and reverse directions by a rotation mechanism such as a motor which is not shown. As a result, the discharge nozzle 276 can be reciprocated in the slit 272a of the cover 272 by the timing belt 281. Therefore, the discharge nozzle 276 discharges the resist solution while moving relatively to the wafer W therebelow and further the inner container 262 is intermittently moved in the Y-direction, whereby the resist solution can be supplied to the wafer W in a manner of so-called single stroke.

Furthermore, a mask member 285 for covering the above of the wafer W and limiting a range of application on the wafer W is provided above the wafer W, and the mask member 285 is supported by mask supporting members 286 provided on the interior walls of the inner container 262. In addition, the mask member 285 is transferable in the X-direction by a transfer mechanism which is not shown. Accordingly, it is possible to keep the mask member 285 waiting in a washing section on the minus direction side in the X-direction (the left direction in FIG. 28) outside the outer container 261 and carry the mask member 285 onto the mask supporting members 286 in the inner container 262 by the transfer mechanism after the inner container 262 including the wafer W is moved to the treatment section R.

The solvent-atmosphere generating means 263 has solvent tanks 290 for storing the solvent. The respective solvent tanks 290 are provided on the bottom surface of the inner container 262. Heaters 291 for heating the solvent in the tanks are attached to the respective solvent tanks 290. The heaters 291 are connected to a controller 292 and generate heat by an electric feed from the controller 292. Additionally, a concentration sensor 293 for detecting a concentration of the solvent atmosphere is attached to the inner container 262. The concentration sensor 293 is connected to the controller 292 so that results of the detection are inputted to the controller 292. As a consequence, the controller 292 is structured so as to control heating by the heaters 291 by adjusting an amount of electric power which is to be supplied to the respective heaters 291 based on the concentration detected by the concentration sensor 293. For example, if the concentration of the solvent atmosphere is lower than a predetermined concentration, the controller 292 increases heating value of the heaters 291 to actively vaporize the solvent in the solvent tanks 290. On the other hand, if the concentration of the solvent atmosphere is higher than the predetermined concentration, the controller 292 does not operate the heaters 291 at all or reduce the heating value of the heaters 291 to inhibit vaporization of the solvent.

The intake means 264 has a plurality of intake pipes 295 and 296 provided on the cover 272. The respective intake pipes 295 are arranged on the cover 272 at equally spaced intervals and extend from the side of the transfer section L to the side of the slit 272a. The respective intake pipes 296 are also arranged on the cover 272 at equally spaced intervals and extend from the side of the treatment section R to the side of the slit 272a. Since any of the intake pipes 295 and 296 has the same structure, the intake pipes 295 will be explained as an example thereof. The respective intake pipes 295 have intake ports 297 opened at positions where the reciprocation of the discharge nozzle 276 is not obstructed by them, in the slit 272a. Opening and closing valves 298 are provided through the respective intake pipes 295 and the opening and closing valves 298 are connected to the aforesaid controller 292. Therefore, the opening and closing of the opening and closing valves 298 are controlled by the controller 292. For example, when the concentration of the solvent atmosphere becomes higher than the predetermined concentration, the controller 292 opens the respective opening and closing valves 298 to suck the solvent atmosphere through the respective intake pipes 295 so that the concentration of the solvent atmosphere inside the inner container 262 is returned to the predetermined concentration. On the other hand, for example, when the concentration of the solvent atmosphere becomes lower than the predetermined concentration, the controller 292 closes the respective opening and closing valves 298 so that the intake by the respective intake pipes 295 is not performed. As shown in FIG. 29 and FIG. 30, opening and closing of opening and closing valves 299 provided through the respective intake pipes 296 is also controlled by the controller 292. These intake pipes 295 and 296 are connected to an exhaust system of a plant.

Next, a function of the resist coating unit 217 as structured above will be explained together with a photolithography process performed in the coating and developing system 200.

First, the delivery arm 207 takes an unprocessed wafer W out of the cassette C to carry it into the adhesion unit 231 included in the third processing unit group G3. Then the wafer W, which is applied with, for example, HMDS for improving adhesion properties of the resist solution, is transferred to the cooling unit 230 by the main arm 213 and cooled to a predetermined temperature. Thereafter, the wafer W is transferred to the resist coating unit 217 or 219.

After being applied with the resist solution in a manner of so-called single stroke described later in the resist coating unit 217 or 219, the wafer W is sequentially transferred to the vacuum drying unit 233, the prebaking unit 234, and the cooling unit 240 by the main arm 213. Thereafter, the wafer W undergoes a series of predetermined processing and treatment such as exposure processing, developing treatment and the like in the respective processing units, and coating and developing treatment is completed.

The function of the resist coating unit 217 as described above will be explained in detail. First of all, the first wafer W, which is cooled to the predetermined temperature in the cooling unit 230, is carried into the casing 260 in the resist coating unit 217 by the main arm 213. At this time, the inner container 262 in the outer container 261 keeps waiting in advance in the transfer section L as shown in FIG. 30. In addition, the carrier inlet/outlet 262a is opened by raising the cover 272. The wafer W is directly placed on the mounting table 265 by the main arm 213 and suction-held thereon. A notch or an orientation flat of the wafer W is detected therein by an alignment mechanism which is not shown, and the wafer W is positioned at a predetermined position by the rotary hoisting and lowering drive mechanism 266. Second, the inner container 262 is moved to the treatment section R by the inner container drive mechanism 271 as shown in FIG. 29. Moreover, the carrier inlet/outlet 262a is closed by lowering the cover 272. After that, the mask member, which is kept waiting in the washing section, is transferred from the outside of outer container 261 to the inside of the inner container 262 by the transfer mechanism which is not shown and placed on the mask supporting members 286.

Figure 31:
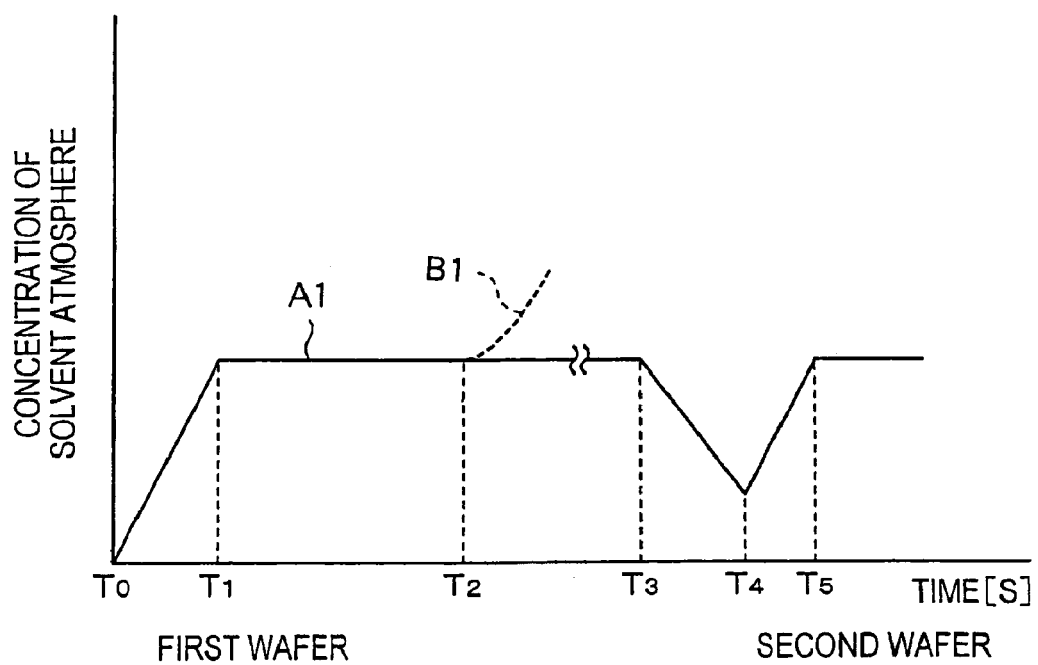
FIG. 31 is a graph showing concentration change of a solvent atmosphere.

An example of concentration change of the solvent atmosphere inside the inner container 262 is shown in FIG. 31. For example, the concentration of the solvent atmosphere inside the inner container 262 is, for example, zero or lower than the predetermined concentration before application is performed (time $T_0$ in FIG. 31) as shown in FIG. 31.

Incidentally, the concentration of the solvent atmosphere inside the inner container 262 is detected by the concentration sensor 293. Then the results of the detection are inputted from the concentration sensor 293 to the controller 292. The controller 292 calculates the amount of electric power which is to be supplied based on the concentration detected by the concentration sensor 293 to perform the electric feed to the heaters 291. The heaters 291 subsequently heat the solvent in the tanks 290 and supply solvent vapor to generate the solvent atmosphere at the predetermined concentration inside the inner container 262 in a short time (time $T_1$ in FIG. 31). Thereafter, the controller stops the electric feed to the heaters 291. After the stop, the inside of the inner container 262 with its upper surface covered with the cover 272 is in a state where the concentration of the solvent atmosphere is easily maintained constant. Since the heating control is performed on the heaters 291 by the controller 292 in this manner, even if the concentration of the solvent atmosphere is low, an amount supplied of the solvent vapor can be increased by accelerating heating by the heaters 291 in accordance therewith. Therefore, it is possible to rapidly make the concentration of the solvent atmosphere inside the inner container 262 the predetermined concentration.

Figure 32:
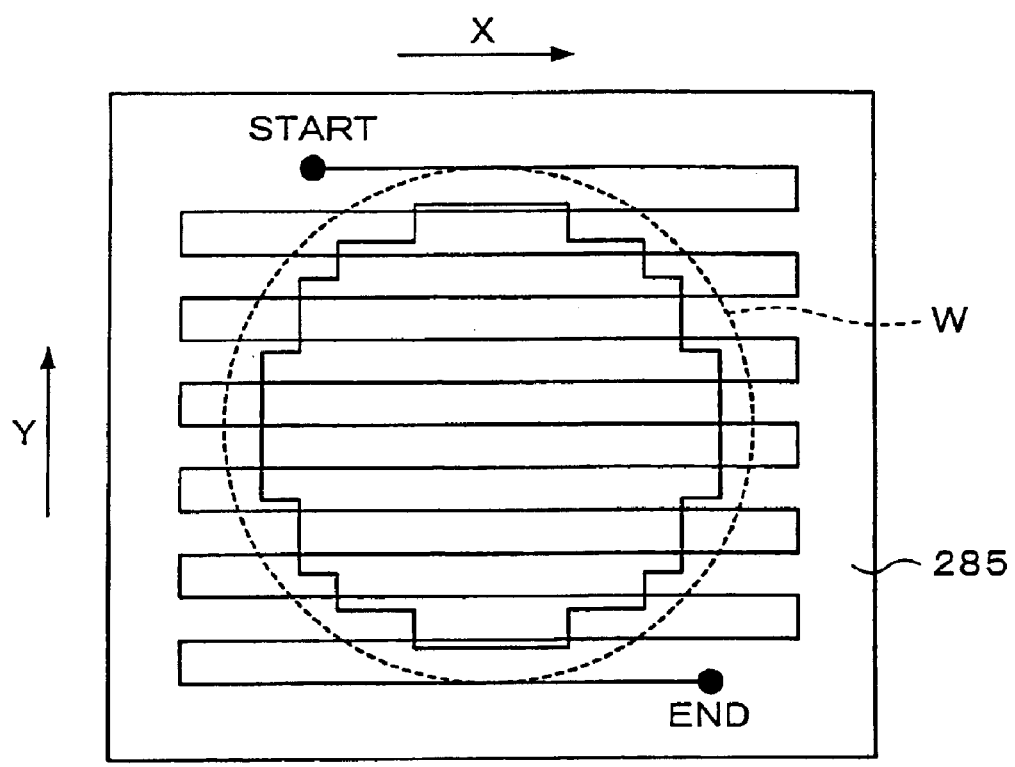
FIG. 32 is an explanatory view showing an application path of the resist solution.

Meanwhile, the discharge nozzle 276 applies the resist solution to the wafer W while moving relatively thereto to form the resist film on the wafer W, for example, in the inner container 262. An example of an application path of the resist solution is shown in FIG. 32. For example, the discharge nozzle 276 initially discharges the resist solution on the wafer W continuously so that the resist solution is formed into a line shape having a fine diameter while moving in a plus direction in an X-direction (a rightward direction in FIG. 32) from a starting position (START) at a predetermined speed as shown in FIG. 32. During the discharge, a line width of a resist solution flow maintains constant. In the inner container 262 filled with the solvent atmosphere at the predetermined concentration, it is possible to reduce the vaporization of the solvent contained in the resist solution to a minimum and properly maintain viscosity of the resist solution. Accordingly, the situation where the resist solution flow intermits can be prevented.

After that, the discharge nozzle 276 moves a distance longer than a diameter of the wafer W, to be more specific, moves to a position which is outside of an end portion of the wafer W at all times, and once comes to a stop on the mask member 285. The resist solution is kept on being discharged also at this time, and the resist solution discharged to portions other than the wafer W is received by the mask member 285 and drained. Then the inner container 262 is displaced a predetermined distance in the Y-direction by the inner container drive mechanism 271 and the wafer W is also displaced in the Y-direction. Thereafter, the discharge nozzle 276 turns, sequentially moves in a minus direction in the X-direction while applying the resist solution, advances to the outside of the wafer W, and comes to a stop in the same manner as described above. The wafer W is subsequently displaced a predetermined distance in the Y-direction, and the discharge nozzle 276 turns once again to apply the resist solution to the wafer W.

The discharge is brought to a stop and the application is completed when the discharge nozzle 276 reaches an ending position (END) shown in FIG. 32 after repeating the above-described processes. This allows a path of the discharge nozzle 276 to be the one as shown in FIG. 32, and the resist solution is applied to the entire face of the wafer W in a manner of so-called single stroke. The wafer W is vibrated by the high-frequency vibrating element 267 attached to the mounting table 265 thereafter so that the resist solution on the wafer W is made flat. And finally, the resist solution is uniformly applied and the resist film having a predetermined film thickness is formed in the range of application on the wafer W.

Incidentally, the solvent contained in the resist solution is vaporized by slow degrees. Therefore, the concentration of the solvent atmosphere inside the inner container 262 gradually becomes high with proceeding of the resist coating. For example, when the concentration of the solvent atmosphere inside the inner container 262 exceeds the predetermined concentration, it is detected by the concentration sensor 293. Then the results of the detection are inputted from the concentration sensor 293 to the controller 292. The controller 292 opens the opening and closing valves 298 and 299 so that the intake is performed by the intake pipes 295 and 296 (time $T_2$ in FIG. 31). By virtue of this, an excessive solvent atmosphere inside the inner container 262 is sucked and the solvent atmosphere is maintained at the predetermined concentration as shown by Graph Line "A1" indicated by the solid line in FIG. 31. As a result, fluidity of the resist solution can be appropriately maintained, whereby it is possible to apply the resist solution flow at the constant line width continuously and form the resist film which is a thin film and uniform in film thickness. If the intake by the intake pipes 295 and 296 is not performed, the concentration of the solvent atmosphere rises upward as shown by Graph Line "B1" indicated by the dotted line in FIG. 31.

After the application of the resist solution is completed, the mask member 285 is carried out from the inside of the outer container 261 by the transfer mechanism which is not shown. Thereafter, the inner container 262 is moved to the transfer section L once again as shown in FIG. 30. The carrier inlet/outlet 262a is opened and the first wafer W is carried out from the inside of the casing 260 by the main arm 213. Then it is transferred to the vacuum drying unit 233 in which the next process is to be performed to undergo drying processing under reduced pressure. The second wafer W is subsequently placed on the mounting table 265. In this manner, carrying out of the first wafer W and the carrying in of the second wafer W are performed (time $T_3$ to $T_4$ in FIG. 31). The inner container 262 housing the second wafer W is moved to the treatment section R as in the manner described above. The carrier inlet/outlet 262a is closed so that the second resist coating is performed.

Incidentally, the carrier inlet/outlet 262a is opened when the wafer is carried in/out, thereby diffusing the solvent atmosphere from the inside of the inner container 262 to the outside. Therefore, the concentration of the solvent atmosphere inside the inner container 262 falls as shown in FIG. 31. However, the heating control is performed on the heaters 291 by the controller 292 also in this case, whereby it is possible to rapidly return the concentration of the solvent atmosphere inside the inner container 262 to the predetermined concentration (time $T_5$ in FIG. 31). In addition, when the concentration of the solvent atmosphere inside the inner container 262 is about to exceed the predetermined concentration during the application, intake by the intake pipes 295 and 296 is performed.

According to the resist coating unit 217 in the embodiment of the present invention, the controller 292 operates the solvent-atmosphere generating means 263 to generate the solvent atmosphere at the predetermined concentration inside the inner container 262 in a short time when the concentration of the solvent atmosphere inside the inner container 262 is lower than the predetermined concentration. On the other hand, when the concentration of the solvent atmosphere inside the inner container 262 is about to exceed the predetermined concentration, the intake means 264 is operated so that the solvent atmosphere inside the inner container 262 is sucked. Accordingly, the concentration of the solvent atmosphere inside the inner container 262 can be maintained constant since it is possible to rapidly cope with the concentration change of the solvent atmosphere such as fall in concentration after carrying in/out of the wafer W and rise in concentration in accordance with proceeding of the resist coating. As a consequence, the resist film which is a thin film and uniform in film thickness can be formed. Further, a throughput can be improved.

Figure 33:
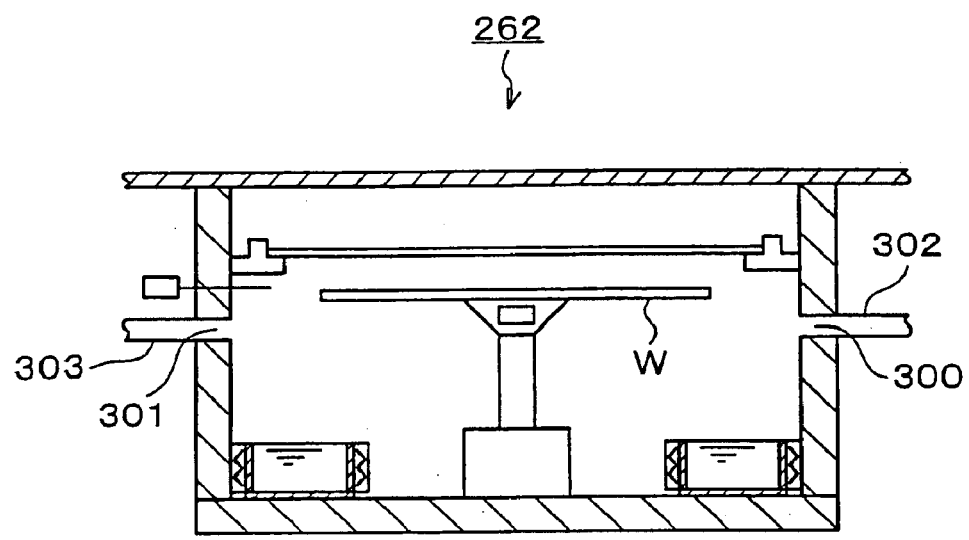
FIG. 33 is an explanatory view of a vertical section of an inner container in a case where intake ports are formed on interior walls thereof.
Figure 34:
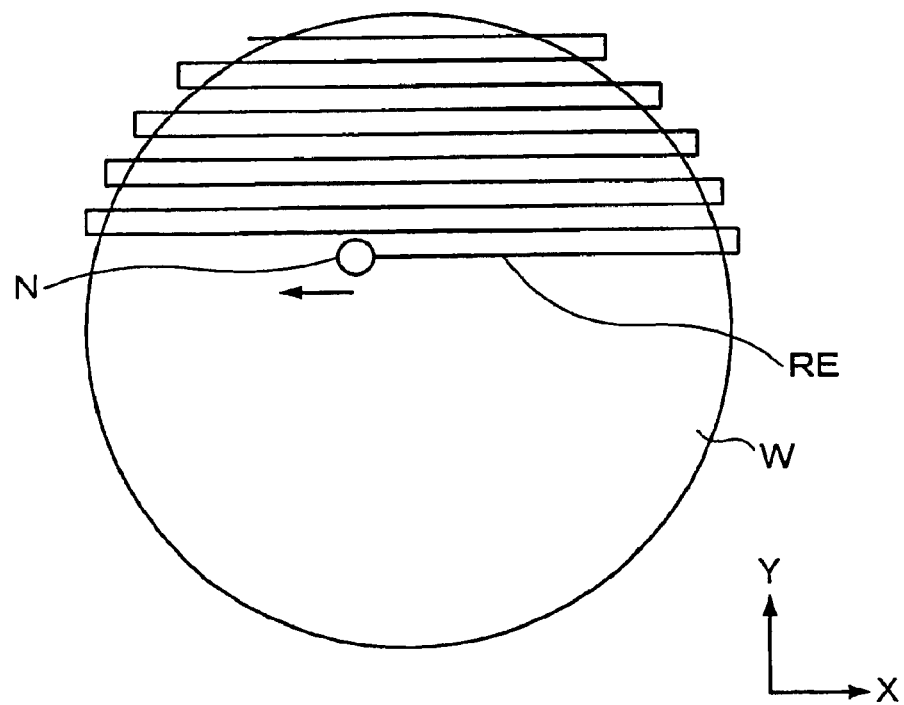
FIG. 34 is an explanatory view showing a coating method of the resist solution examined by the inventor.

It should be noted that one example of the resist coating unit according to the embodiment of the present invention has been explained, but various modifications are employable to the resist coating unit of the present invention other than this example. For example, as shown in FIG. 33, intake ports 300 and 301 may be formed directly on the interior walls of the inner container 262 and an intake pipe 302 and an intake pipe 303 may be connected to the intake port 300 and the intake port 301, respectively. Such structure also allows the intake to be performed.

Moreover, although the resist solution is applied in a manner of so-called single stroke in the above-described embodiment, the resist coating unit according to the present invention is also applicable to the case where the application is performed in other methods, for example, a spin coating method in which the resist solution is applied while the wafer W is rotated, or the like.

In the above description, a substrate to be treated in the present invention may be an LCD substrate, and the coating solution is not limited to the resist solution but it may be liquid for interlayer dielectrics, liquid for high conductive films, liquid for ferroelectric films, silver paste, or the like. In addition, pre-treatment (hydrophobic processing, cooling) and post-treatment are performed before and after the application of the coating solution in the embodiments described above, but the present invention is also applicable to a unit in a case where either the pre-treatment or the post-treatment for the coating treatment is performed.

Moreover, although the resist solution is described as an example of the coating solution required for film formation in the above-described embodiments, it is not limited to this. A coating solution for interlayer dielectrics, a coating solution for high conductive films, a coating solution for ferroelectrics, a coating solution for metal films, or the like is given as an example of other coating solutions. Further, the present invention is also applicable to a film forming apparatus for a substrate other than the wafer W, for example, an LCD substrate.

It is to be understood that the present invention is not limited to the above-described embodiments. The embodiments has been disclosed to simplify an understanding of the present invention, and the scope of the present invention is not limited by these embodiments but various improvements, changes and so on may be made by the spirit of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating film forming apparatus for forming a coating film by applying a coating solution to a substrate comprising:

a cassette mounting section on which a substrate cassette housing a plurality of substrates is mounted;

a coating unit for applying the coating solution to the substrate taken out of the substrate cassette which is mounted on said cassette mounting section;

plural treatment units for performing at least either pre-treatment or post-treatment for treatment of applying the coating solution;

a reduced-pressure drying unit for drying under a reduced-pressure atmosphere the substrate which is applied with the coating solution in said coating unit, provided as one of said plural treatment units; and a main transfer mechanism for transferring the substrate between said coating unit and said treatment units, wherein said coating unit has a substrate holding portion for holding the substrate, a coating solution nozzle for discharging the coating solution to the substrate, provided to be opposed to the substrate held by the substrate holding portion, and a drive mechanism for moving the coating solution nozzle relatively to the substrate along a surface thereof while discharging the coating solution to the surface of the substrate from the coating solution nozzle, and said main transfer mechanism has a holding member for holding the substrate, a cover body for surrounding the holding member provided with an opening portion for allowing the holding member to advance and retract and which moves up and down with the holding member and atmosphere forming means for making an atmosphere in which the substrate is held by the holding member an atmosphere in which vaporization of solvent is inhibited.

2. The apparatus according to claim 1, wherein the atmosphere forming means comprises means for supplying solvent vapor.

3. The apparatus according to claim 1, wherein the atmosphere forming means comprises means for making the atmosphere at least either an atmosphere at a predetermined temperature or an atmosphere at a predetermined humidity.

4. The apparatus according to claim 1, further comprising washing means including means for supplying a washing solution to the holding member and means for supplying gas for drying to the holding member.

5. The apparatus according to claim 1, further comprising a coating film removing unit for removing the coating film at a peripheral portion of the substrate which is dried under reduced pressure in said reduced-pressure drying unit, provided as one of said plural treatment units.

6. The apparatus according to claim 1, wherein application is performed while the coating solution is discharged in a line shape having a fine diameter from the coating solution nozzle.

7. The apparatus according to claim 1, further comprising a mask for covering portions except for a region of coating film formation on the substrate and receiving the coating solution from the coating solution nozzle.

8. The apparatus according to claim 1, wherein said cover body comprises a box shaped cover body surrounding only the main transfer mechanism.

9. A coating film forming apparatus forming a coating film by applying a coating solution to a substrate comprising:

a cassette mounting section on which a substrate cassette housing a plurality of substrates is mounted;

a coating unit for applying the coating solution to the substrate taken out of the substrate cassette which is mounted on said cassette mounting section;

plural treatment units for performing at least either pre-treatment or post-treatment for treatment of applying the coating solution;

a reduced-pressure drying unit for drying under a reduced-pressure atmosphere the substrate which is applied with the coating solution in said coating unit, provided as one of said plural treatment units; and a main transfer mechanism for transferring the substrate between said coating unit and said treatment units, wherein said coating unit has a substrate holding portion for holding the substrate, a coating solution nozzle for discharging the coating solution to the substrate provide to be opposed to the substrate held b the substrate holding portion, and a drive mechanism for moving the coating solution nozzle relatively to the substrate along a surface thereof while discharging the coating solution to the surface of the substrate from the coating solution nozzle, and said main transfer mechanism has a holding member for holding the substrate, washing means for washing the holding member, and atmosphere forming means for making an atmosphere in which the substrate is held by the holding member an atmosphere in which vaporization of solvent is inhibited.

10. The apparatus according to claim 9, wherein the atmosphere forming means comprises means for supplying solvent vapor.

11. The apparatus according to claim 9, wherein the atmosphere forming means comprises means for making the atmosphere at least either an atmosphere at a predetermined temperature or an atmosphere at a predetermined humidity.

12. The apparatus according to claim 9, wherein said washing means comprises means for supplying a washing solution to the holding member and means for supplying gas for drying to the holding member.

13. The apparatus according to claim 9, further comprising a coating film removing unit for removing the coating film at a peripheral portion of the substrate which is dried under reduced pressure in said reduced-pressure drying unit, provided as one of said plural treatment units.

14. The apparatus according to claim 9, wherein application is performed while the coating solution is discharged in a line shape having a fine diameter from the coating solution nozzle.

15. The apparatus according to claim 9, further comprising a mask for covering portions except for a region of coating film formation on the substrate and receiving the coating solution from the coating solution nozzle.

16. A coating film forming apparatus for forming a coating film by applying a coating solution to a substrate comprising:

a cassette mounting section on which a substrate cassette housing a plurality of substrates is mounted;

a coating unit for applying the coating solution to the substrate taken out of the substrate cassette which is mounted on said cassette mounting section;

plural treatment units for performing at least either pre-treatment or post-treatment for treatment of applying the coating solution;

a reduce-pressure drying unit for drying under a reduced-pressure atmosphere the substrate which is applied with the coating solution in said coating unit, provided as one of said plural treatment units, and a main transfer mechanism for transferring the substrate between said coating unit and said treatment units, wherein said coating unit has a substrate holding portion for holding the substrate, a coating solution nozzle for discharging the coating solution to the substrate, provided to be opposed to the substrate held by the substrate holding portion, and a drive mechanism for moving the coating solution nozzle relatively to the substrate along a surface thereof while discharging the coating solution to the surface of the substrate from the coating solution nozzle, and said main transfer mechanism has a holding member for holding the substrate, detecting means for detecting a stain of the holding member, and atmosphere forming means for making an atmosphere in which the substrate is held by the holding member an atmosphere in which vaporization of solvent is inhibited.

17. The apparatus according to claim 16, wherein the atmosphere forming means comprises means for supplying solvent vapor.

18. The apparatus according to claim 16,
wherein the atmosphere forming means comprises means for making the atmosphere at least either an atmosphere at a predetermined temperature or an atmosphere at a predetermined humidity.

19. The apparatus according to claim 16,
further comprising a coating film removing unit for removing the coating film at a peripheral portion of the substrate which is dried under reduced pressure in said reduced-pressure drying unit, provided as one of said plural treatment units.

20. The apparatus according to claim 16,
wherein application is performed while the coating solution is discharged in a line shape having a fine diameter from the coating solution nozzle.

21. The apparatus according to claim 16,
further comprising a mask for covering portions except for a region of coating film formation on the substrate and receiving the coating solution from the coating solution nozzle.

* * * * *